US 10,481,189 B2

United States Patent
Kuyvenhoven et al.

(10) Patent No.: US 10,481,189 B2
(45) Date of Patent: Nov. 19, 2019

(54) SYSTEM AND METHOD FOR MEASURING VARIABLE IMPEDANCE ELEMENTS IN A WIRELESS SENSOR

(71) Applicant: Philips IP Ventures B.V., Eindhoven (NL)

(72) Inventors: Neil W. Kuyvenhoven, Ada, MI (US); Cody D. Dean, Grand Rapids, MI (US); David W. Baarman, Fennville, MI (US); Benjamin C. Moes, Wyoming, MI (US); Hai D. Nguyen, Grand Rapids, MI (US); Matthew J. Norconk, Grand Rapids, MI (US); Joshua K. Schwannecke, Grand Rapids, MI (US); Joshua B. Taylor, Rockford, MI (US); Joseph S. Melton, Jr., Grand Rapids, MI (US); Ronald L. Stoddard, Kentwood, MI (US)

(73) Assignee: Philips I.P. Ventures B.V., Eindhoven (NL)

( * ) Notice: Subject to any disclaimer, the term of this patent is extended or adjusted under 35 U.S.C. 154(b) by 216 days.

(21) Appl. No.: 14/399,276

(22) PCT Filed: Mar. 14, 2013

(86) PCT No.: PCT/US2013/031134
§ 371 (c)(1),
(2) Date: Nov. 6, 2014

(87) PCT Pub. No.: WO2013/169356
PCT Pub. Date: Nov. 14, 2013

(65) Prior Publication Data
US 2015/0123679 A1   May 7, 2015

Related U.S. Application Data

(60) Provisional application No. 61/701,205, filed on Sep. 14, 2012, provisional application No. 61/645,185, filed on May 10, 2012.

(51) Int. Cl.
*G01R 27/28* (2006.01)
*G06K 19/07* (2006.01)
(Continued)

(52) U.S. Cl.
CPC .............. *G01R 27/28* (2013.01); *G01R 23/00* (2013.01); *G06K 19/0717* (2013.01); *H04B 5/0081* (2013.01)

(58) Field of Classification Search
CPC ...... G01R 27/28; G01R 23/00; H04B 5/0081; G06K 19/0717
See application file for complete search history.

(56) References Cited

U.S. PATENT DOCUMENTS 3,742,179 A    6/1973  Harnden, Jr.
4,391,146 A *  7/1983  Grindheim .............. G01L 9/125
                                                        324/675
(Continued)

FOREIGN PATENT DOCUMENTS

DE    3113557 A1    10/1982
JP    5032822        10/1975
(Continued)

OTHER PUBLICATIONS

International Search Report and Written Opinion of the International Searching Authority for International Application No. PCT/US2013/031134 dated Oct. 14, 2013.
(Continued)

*Primary Examiner* — Akm Zakaria

(57) ABSTRACT

A wireless remote sensor (110) that is powered by an inductive transmitter (112) and is configured to produce an oscillating wave that varies based on one or more sensed parameters. The oscillating wave is communicated to the inductive transmitter (112) by reflected impedance, where it can be detected to determine the sensed value(s). In another (Continued)

aspect, the present invention provides a wireless remote sensor with a Wheatstone bridge arrangement having an internal resonant circuit to produce an electromagnetic field indicative of the sensed value. In a third aspect, the present invention provides a wireless remote sensor with optical feedback from a reference circuit and a sensor circuit. In a fourth aspect, the present invention provides a wireless remote temperature sensor having coils printed on a material with a high coefficient of thermal expansion so that the size and/or shape of the coils varies as the temperature increases or decreases.

30 Claims, 20 Drawing Sheets

(51) Int. Cl.
    *H04B 5/00*     (2006.01)
    *G01R 23/00*     (2006.01)

(56) References Cited

U.S. PATENT DOCUMENTS

| | | | | |
|---|---|---|---|---|
| 5,682,149 | A | | 10/1997 | Hofman |
| 6,137,447 | A | * | 10/2000 | Saitoh ............... G06K 7/10336 235/492 |
| 6,153,983 | A | | 11/2000 | Nerone et al. |
| 2007/0222590 | A1 | | 9/2007 | Posamentier |
| 2010/0277003 | A1 | * | 11/2010 | Von Novak ............ H02J 17/00 307/104 |
| 2011/0053500 | A1 | * | 3/2011 | Menegoli ............ H04B 5/0037 455/41.1 |
| 2012/0223590 | A1 | * | 9/2012 | Low ..................... H02J 5/005 307/104 |
| 2012/0249449 | A1 | * | 10/2012 | Tseng .................. G06F 3/0418 345/173 |
| 2013/0002034 | A1 | * | 1/2013 | Onizuka ................ H02J 5/005 307/104 |

FOREIGN PATENT DOCUMENTS

| | | |
|---|---|---|
| JP | 1980125424 | 9/1980 |
| JP | 1995249189 | 9/1995 |
| JP | 2001068279 | 3/2001 |

OTHER PUBLICATIONS

Dehennis, Andrew D., et al., "A Wireless Microsystem for the Remote Sensing of Pressure, Temperature, and Relative Humidity", Journal of Microelectromechanical Systems, vol. 14, No. 1, Feb. 2005, pp. 12-22.

"Fundamentals of electronic technology—Simulation", published May 1991, Kang, Huaguang, Higher Education Press, pp. 228-231 and 421-425.

\* cited by examiner

TWIN T OSCILLATOR

.tran 0 .0001 .0000001 .0000001 startup

SYSTEM AND METHOD FOR MEASURING VARIABLE IMPEDANCE ELEMENTS IN A WIRELESS SENSOR

BACKGROUND OF THE INVENTION

The present invention relates to wireless sensors, and more particularly to systems and methods for remotely powering and remotely determining the value of sensor in a wireless remote sensor.

There is a growing focus on and the development of wireless remote sensors. Wireless remote sensors may be used in a variety of applications. For example, wireless remote sensors may include transdermal and internal medical sensors, inductively powered heating and cooking containers and sensors located in product packaging. Some exemplary wireless remote sensors are shown in U.S. patent application Ser. No. 13/082,503, entitled "Point of Sale Inductive Systems and Methods," filed Apr. 8, 2011, by Baarman et al and U.S. patent application Ser. No. 13/082,513, entitled "Point of Sale Inductive Systems and Methods," filed Apr. 8, 2011, by Baarman et al, both of which are incorporated herein by reference in their entirety.

Wireless remote sensors are convenient in that they can provide a mechanism for measuring relevant information and communicating that measurement to a receiver without the need for wires. For examples, measurements can be taken with plugging in the sensor. Further, after the measurement is taken, it is not necessary to unplug the sensor. With internal medical sensors the importance of wireless communication with the sensor is even greater.

Wireless remote sensors are typically powered by and communicate with an inductive transceiver. This means that the power used to operate the sensor can be provided to the wireless remote sensor without the need for wires or other direct electrical contact. For example, a number of conventional remote sensors wirelessly receive power from an inductive wireless power supply. With inductively powered wireless remote sensors, it is not uncommon for the sensor value (e.g. the value being measured by the remote sensor) to be communicated to the inductive transmitter via reflected impedance. Many conventional wireless remote sensors incorporate a sensor having a capacitance or resistance that varies as a function of the parameter to be measured. For example, when measuring temperature, the sensor may include a thermistor having an impedance that varies with temperature. As another example, the sensor may include a capacitor with a dielectric that varies its dielectric coefficient over temperature. The remote sensor is typically configured with the variable capacitor or resistor arranged as part of a simple RLC circuit so that variations in the sensor result in changes in the resonant frequency of the RLC circuit. The RLC circuit is inductively coupled to the inductive transmitter so that the RLC circuit affects a characteristic of power in the inductive transmitter via reflected impedance. For example, the reflected impedance of the RLC circuit can affect the amplitude of current in the inductive transmitter tank circuit. Accordingly, in use, the value of the sensor is communicated back to the inductive transmitter, where it can be detected by a sensor that monitors a characteristic of power in the inductive transmitter, for example, in the amplitude of current and/or the resonant frequency of power in the inductive transmitter tank circuit.

Experience has revealed that relatively small variations in the impedance of a wireless remote sensor are difficult to detect in the inductive transmitter. Further, these variations can be masked by changes in the coupling between the inductive transmitter and the remote sensor or by variations in manufacturing tolerances.

SUMMARY OF THE INVENTION

In one aspect, the present invention provides a wireless remote sensor that is configured to produce an oscillating wave that varies based on one or more sensed parameters. The oscillating wave is communicated to the inductive transmitter by reflected impedance, where it can be detected to determine the value of the sensed parameter(s). In one embodiment, the oscillating wave is roughly a square wave produced by a charge/discharge circuit, with the low portion of the square wave corresponding with the charge time and the high portion corresponding with the discharge time. Alternatively, the oscillating wave may be produced as a sine wave.

In one embodiment, the charge/discharge circuit includes a charge subcircuit and a discharge subcircuit. The charge subcircuit may include an RC circuit having a charge capacitor that is charged during the charge period. In one embodiment, the RC circuit includes a charge resistor, and the time required to charge the charge capacitor varies depending on the value of the charge resistor.

In one embodiment, the discharge subcircuit includes a current latch that discharges the capacitor during the discharge period. The current latch may be configured to discharge the charge capacitor through a modulation resistor to produce the high portion of the square wave. The modulation resistor may be selected to control the amplitude of the high portion of the square wave.

In one embodiment, the charge/discharge circuit further includes a trigger that causes the charge/discharge circuit to transition between the charge and discharge states. The trigger may be one or more diodes that are arranged so that their reverse breakdown voltage is exceeded once the charge capacitor is sufficiently charged. Once exceeded, power may be free to discharge from the charge capacitor through the modulation resistor.

In one embodiment, the remote sensor include two sensors and the duration of the high portion of the square wave varies with the value of one sensor and the duration of the low portion of the square wave varies with the value of the other sensor. The first sensor may be disposed within the charge subcircuit to vary the time required to charge the charge capacitor. In one embodiment, the charge capacitor is an RC circuit and the first sensor is a variable impedance element in the RC circuit, such as a variable resistor and/or variable capacitor. The second sensor may be disposed between the charge capacitor and the discharge subcircuit. In one embodiment, the second sensor is a variable resistor.

In one embodiment, the wireless remote sensor is configured to normalize to a constant voltage so that the charge/discharge time of the circuit is not dependent on coupling between the inductive transmitter and the wireless remote sensor. In one embodiment, a zener diode, or alternatively another type of constant voltage reference, is added to the wireless remote sensor.

In another embodiment, the wireless remote sensor includes an adaptive trigger that is configured to normalize the charging time regardless of variations in coupling or in received voltage. In this embodiment, the trigger may include a voltage divider and a comparator. The output of the voltage divider may be provided as a reference input to the comparator that varies with received power. In use, the adaptive trigger may be configured so that any change in the charging rate of the charge capacitor is met with a corresponding change in the trigger threshold so that charging time remains essentially constant despite changes in received voltage.

In another embodiment, the wireless remote sensor includes a voltage controlled oscillator ("VCO") that uses a variable impedance element as a sensor. Changes in the impedance of the variable impedance element change the oscillation frequency of the VCO. The output of the VCO may be applied directly to the receiving coil or it may be applied to a modulation subcircuit configured to modulate a load. For example, if the internal resistance of the VCO is sufficient to generate a signal that can be recognized in the transmitter, then a separate modulation subcircuit may not be used. If the internal resistance is not sufficient, the output of the VCO may be buffered and used to activate a switch to modulate a load.

In a second aspect, the present invention provides a wireless remote sensor system that uses a Wheatstone bridge arrangement with an internal resonant circuit that produces an electromagnetic field indicative of the sensed value. A separate sense coil can be used to wirelessly receive the electromagnetic field and determine the sensed value. The Wheatstone bridge assembly amplifies relatively small changes in the sensor element, thereby making it easier to recognize changes in the value of the sensed parameter.

In alternative embodiments, variable impedance elements may be incorporated into one or more legs of the Wheatstone bridge and/or into the internal resonant circuit to allow the use of a plurality of sensor elements and/or to further amplify changes in the sensor element.

In a third aspect, the present invention provides a wireless remote sensor having multiple coils that allow the system to compensate for variations in coupling coefficient, sensor drift, transmitter drift or many other potential circuit changes over time. In this embodiment, the wireless remote sensor may include a reference circuit and a sensor circuit. The reference circuit may have fixed components and vary substantially only with variations in coupling between the inductive transmitter and the reference circuit and circuit drift over time. The sensor circuit may include a variable impedance element that varies with the measured characteristic. In use, the sensor circuit may vary with changes in the impedance element, as well as changes in the coupling between the inductive transmitter and the sensor circuit and circuit drift over time. Accordingly, changes in the reference circuit can be effectively subtracted from changes in the sensor circuit to isolate the amount of changes that is caused by variations in the sensor impedance element.

In one embodiment the reference circuit and the sensor circuit include LEDs for communicating to the inductive transmitter, and the inductive transmitter includes optical sensors for determining the brightness of the two LEDs. The reference circuit may include fixed components so that changes in the brightness of the reference LED are based primarily on the coupling coefficient between the inductive transmitter and the reference circuit, changes in the emissivity of the LEDs over time or other forms of circuit drift over time. The sensor circuit may include a variable impedance element having an impedance that varies with the value of the sensed parameter. The brightness of the sensor LED in the sensor circuit may vary based on the value of the sensor impedance element, as well as the coupling coefficient, changes in the emissivity of the LEDs over time and other forms of circuit drift over time. The affect of the sensor impedance element can be generally isolated by subtracting any change in the value of the reference LED from any change in the value of the sensor LED.

In a fourth aspect, the present invention provides a wireless remote temperature sensor having coils printed on a material with a high coefficient of thermal expansion so that the size and/or shape of the coils vary as the temperature increases or decreases. The change in the size and/or shape of the coils results in changes in the reflected impedance of the wireless remote temperature sensor. As a result, temperature can be determined by measuring in the inductive transmitter a characteristic of power that is affected by reflected impedance. In one embodiment, the sensed value is determined by measuring current amplitude in the inductive transmitter. In one embodiment, the receiver coil is formed from an "ink" that is printed onto the underlying substrate. In one embodiment, the receiver coil is formed from a material having a lower coefficient of thermal expansion than the substrate. In this embodiment, the receiver coil may be formed with a plurality of undulations that provide the coil with the ability to change shape as the underlying substrate expands and contracts. The undulations are arranged to allow the coil to flex so that changes in the size of the substrate with result in changes in the overall shape of the coil. The changes in the overall shape of the coil impact the reflected impedance of the wireless remote sensor and can be sensed in the inductive transmitter.

In a fifth aspect, a VCO may be used with a variable impedance element to apply a signal to an antenna, wherein the frequency transmitted by the antenna is received by the base unit sensor. In this embodiment, the antenna may be a whip antenna, dipole, inverted F, loop, or any other type of antenna. This signal produces an electric field as opposed to a magnetic field, which does not interact as much with the magnetic field of the power transfer. Additionally, if desired, the frequency or frequencies of the VCO may be at a much higher or lower frequency than the power transfer signal to further reduce the interaction or interference.

In a sixth aspect, a VCO may be used with a variable impedance element to apply a signal to a coil that is separate from the power receiving coil. The separate coil uses a magnetic field signal to transmit the signal back to a base unit sensor. In this embodiment, the coil may be isolated from the power transfer coil by a distance, or by winding the coil in a "FIG. 8" orientation. Additionally, if desired, the frequency of the VCO may be much higher or much lower than the power transfer signal to further reduce the interaction or interference.

The present invention provides a variety of simple and effective wireless remote sensor systems configured to allow sensed values to be wirelessly determined using a simple and inexpensive remote device. In those embodiments that include a variable oscillator, changes in the sensed value(s) can be readily determined based on changes in the oscillating wave that are easily measured in a remote device. Wireless remote sensors with a variable oscillator can also be configured to normalize for changes in coupling and other factors that might affect received power. In those embodiments that include a Wheatstone bridge arrangement, even small changes in the sensed values can be amplified and communicated to a remote device using a separate communication channel, such as a separate set of coils. In Wheatstone bridge systems, the power coils and feedback coils can be arranged to minimize interference between the two coil sets. In one embodiment, counter-wound feedback coils can be used to effectively cancel out interference from the power coils. In those embodiments that include an optical communication scheme, a reference circuit and sensor circuit can be combined to allow changes in the sensed value(s) to be isolated from changes in coupling and other factors that affect received power. The receiver coils of the reference circuit and sensor circuit may be wrapped together about the same axis and through the same plane so that they have essentially the same coupling coefficient with the inductive transmitter. In another aspect, the present invention provides a wireless temperature sensor in which temperature variations are simply and accurately wirelessly communicated to a remote device based on changes in the size and/or shape of a receiving coil substrate with a relatively high coefficient of thermal expansion. In this embodiment, the substrate functions as the temperature sensor, thereby eliminating the need for separate sensor elements.

These and other features of the invention will be more fully understood and appreciated by reference to the description of the embodiments and the drawings.

Figure 1:
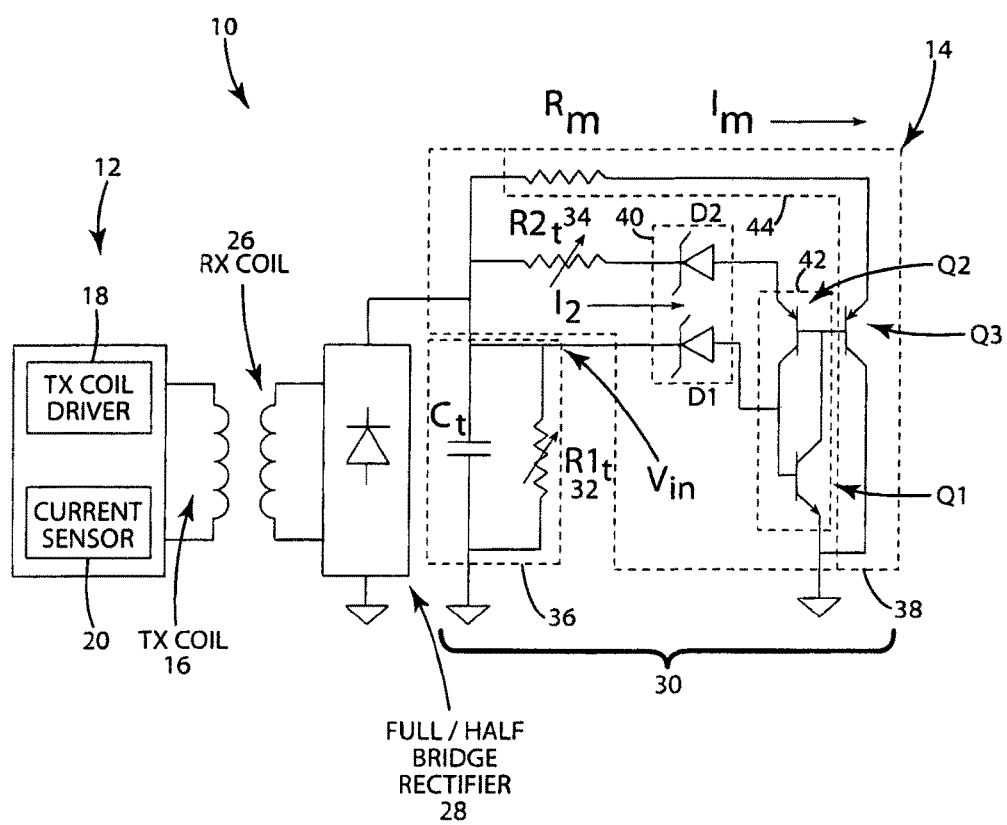
FIG. 1 is a schematic representation of a system having an inductive transmitter and wireless remote sensor.

Before the embodiments of the invention are explained in detail, it is to be understood that the invention is not limited to the details of operation or to the details of construction and the arrangement of the components set forth in the following description or illustrated in the drawings. The invention may be implemented in various other embodiments and of being practiced or being carried out in alternative ways not expressly disclosed herein. Also, it is to be understood that the phraseology and terminology used herein are for the purpose of description and should not be regarded as limiting. The use of "including" and "comprising" and variations thereof is meant to encompass the items listed thereafter and equivalents thereof as well as additional items and equivalents thereof. Further, enumeration may be used in the description of various embodiments. Unless otherwise expressly stated, the use of enumeration should not be construed as limiting the invention to any specific order or number of components. Nor should the use of enumeration be construed as excluding from the scope of the invention any additional steps or components that might be combined with or into the enumerated steps or components.

DESCRIPTION OF CURRENT EMBODIMENTS

A wireless remote sensor system in accordance with an embodiment of the present invention is shown in FIG. 1. In this embodiment, the system 10 generally includes an inductive transmitter 12 and a wireless remote sensor 14. In this embodiment, the inductive transmitter 12 is capable of transmitting wireless power to the wireless remote sensor 14 using magnetic induction. The inductive transmitter 12 wirelessly supplies power to and receives sensor information from the wireless remote sensor 14. More specifically, in use, the inductive transmitter 12 supplies power to the wireless remote sensor 14. The wireless remote sensor 14 includes a resonant circuit that is activated by the wireless power received from the inductive transmitter 12, and responds according to the value(s) of one or more variable impedance elements within the wireless remote sensor 14.

In this embodiment, the wireless remote sensor 14 includes one or more variable impedance elements that vary with the parameter to be sensed by the wireless remote sensor 14. For example, the wireless remote sensor 14 may includes a variable resistor that varies with temperature. The wireless remote sensor 14 is configured to produce an oscillating wave having characteristics that vary with the parameter(s) to be sensed by the wireless remote sensor 14. For example, the wireless remote sensor 14 may produce an oscillating wave in which the duration of the high and low portions of the wave may vary depending on sense parameters. In the embodiment of FIG. 1, the wireless remote sensor 14 includes two sensors and a charge/discharge circuit that produces a generally square wave with high and low portions that vary in duration depending on the sensors. The first sensor may have a variable impedance element that varies with a parameter to be measured. The variable impedance element of the first sensor may be configured to vary the charging time of the circuit. The second sensor may have a variable impedance element that varies with the second parameter to be measured. The second variable impedance element may be configured to vary the discharging time of the circuit.

For purposes of disclosure, the present invention is described in connection with various wireless remote sensors that include temperature sensors that have variable resistors that vary with changes in temperature. The present invention may be incorporated into wireless remote sensors for monitoring essentially any parameters that can be measured with a sensor having a variable impedance element, such as a variable resistor or a variable capacitor. For example, wireless remote sensors in accordance with the present invention could measure temperature, dissolved O2, salinity, or other bioelectrical signals. The present invention is well-suited for use in current and future applications where these types of sensors may be employed, including transdermal and internal medical sensors, inductively powered heating and cooking containers and sensors located in product packaging.

As noted above, the wireless remote sensor system 10 generally includes an inductive transmitter 12 and a wireless remote sensor 14. The inductive transmitter 12 may be a generally conventional inductive power transmitter having a transmitter coil 16 for generating an electromagnetic field, a driver 18 for supplying power to the transmitter coil 16 and a transmitter sensor 20 for sensing a characteristic of power in the inductive transmitter 12. The transmitter coil 16 may vary from application to application, but in this embodiment is a coil of wire capable of generating an appropriate electromagnetic field in response to the flow of power through the coil 16. Although the transmitter coil 16 is a coil in this embodiment, the transmitter coil 16 may be essentially any inductor capable of generating an appropriate electromagnetic field. The transmitter coil 16 may be incorporated into a tank circuit, and more specifically, into a series resonant tank circuit. The series resonant tank circuit may have an inherent resonant frequency or may be an adaptable circuit capable of being adjusted to have different frequencies. For example, the tank circuit may have a selectively variable capacitor and/or a selectively variable inductor. The driver 18 may be configured to supply AC power to the transmitter coil 16 at a desired operating frequency. When supplying power to a tank circuit, the driver 18 may be configured to supply power to the tank circuit at or near the resonant frequency of the tank circuit. In this embodiment, the transmitter sensor 20 is a current sensor configured to measure current in the transmitter coil 16. The transmitter sensor 20 may, however, vary from application to application. In alternative embodiments, the current sensor may be replaced by any other sensor (or sensors) capable of measuring a characteristic (or characteristics) of power in the inductive transmitter 12 that is affected by the reflected impedance of the wireless remote sensor 14. For example, the transmitter sensor 20 may be configured to sense resonant frequency, current, power or phase.

The wireless remote sensor 14 generally includes a receiving coil 26, a rectifier 28 and a charge/discharge circuit 30. The receiving coil 26 may be a coil of wire or other inductor in which current is induced by the electromagnetic field produced by the transmitter coil 16. The receiving coil 26 may be incorporated into a tank circuit, and more specifically, into a series resonant tank circuit. The series resonant tank circuit may have an inherent resonant frequency or may be an adaptable circuit capable of being adjusted to have different frequencies. The rectifier 28 may be essentially any full or half bridge rectifier, as desired. The charge/discharge circuit 30 is coupled to the receiving coil 26 is such a way that it represents a variable load that varies over time depending on the value of the parameter or parameters being measured by the wireless remote sensor 14. In operation, this variable load is communicated back to transmitter coil 16 by reflected impedance, where it can be recognized by the transmitter sensor 20. In this embodiment, the charge/discharge circuit 30 varies to create an oscillating wave with high and low portion that vary in duration based on the values of two sensed parameters. Although the wireless remote sensor 14 of this embodiment includes two sensor elements 32, 34, the wireless remote sensor 14 may include a single sensor element 32 or 34, if desired.

FIG. 1 shows an embodiment of the present invention in which the wireless remote sensor 14 includes a charge/discharge circuit 30 that uses a hysteretic-controlled variable timing circuit to provide feedback to the inductive transmitter 12. In this embodiment, the charge/discharge circuit 30 generally includes a charge subcircuit 36, a discharge subcircuit 38 and a trigger 40. The charge subcircuit 36 of this embodiment includes an RC circuit having a charge capacitor $C_t$ and a charge resistor $R1_t$. In this embodiment, the charge resistor $R1_t$ is sensor element 32 and its resistance varies with the sensed parameter. For example, the charge resistor $R1_t$ may be a thermistor having a resistance that varies with temperature. In use, the RC circuit determines the rate at which the voltage output of the rectifier rises. The discharge subcircuit 38 of this embodiment generally includes a modulation resistor $R_m$, a variable resistor $R2_t$, a current latch 42 and a modulation leg 44. The modulation resistor $R_m$ may be a resistor having a fixed resistance selected to provide the oscillating wave with the desired amplitude. The variable resistor $R2_t$ may be sensor element 34 and its resistance may vary with the second sensed parameter. For example, this sensor element 34 may be a thermistor having a resistance that varies with a second temperature measurement. The current latch 42 includes transistors Q1 and Q2 that are arranged to allow current to discharge from the charge capacitor $C_t$. In this embodiment, the trigger 40 controls the timing of the discharge subcircuit 38, and includes a pair of diodes D1 and D2 that determine the voltage at which the current latch 42 turns "on" and "off." In the illustrated embodiment, diode D1 may be a zener diode that determines the voltage at which current latch 42 turns "on" and diode D2 may be a zener diode that determines the voltage at which current latch 42 turns "off." Once there is sufficient voltage stored in the RC circuit, the reverse breakdown voltage of diode D1 is reached, allowing current to flow through diode D1. This current raises the voltage at the base of transistor Q1, turning it on. Once on, the current flowing into the collector of transistor Q1 is drawn from the base of transistor Q2 and transistor Q3, turning both of them on as well. Because transistor Q2 is turned on, current flows through discharge resistor R2$_t$ and diode D2, flowing into the base of transistor Q1, keeping transistor Q1 on until the breakdown voltage of diode D2 is reached. This reverse breakdown voltage is lower than the reverse breakdown voltage of diode D1 to ensure that current latch 42 is turned off at a lower voltage than it is turned on. When desired, the discharge subcircuit 38 may include a modulation leg 44 having a modulating resistor R$_m$. The modulation leg 44 includes a transistor Q3 which, while on, allows current to flow through modulating resistor R$_m$. In this embodiment, transistor Q3 is coupled to current latch 42 so that transistor Q3 is turned on when the current latch 42 is on and turned off when the current latch 42 is off. In this embodiment, the resistance of the modulating resistor R$_m$ is small enough to cause the current in the transmitting base to rise.

Thus, the time during which the charge subcircuit is being charged is determined by the coupling factor, the reverse breakdown voltage of diode D1 and the resistance of charge resistor R1$_t$. As the resistance of charge resistor R1$_t$ increases, the time it takes to charge the charge subcircuit is reduced. The time during which the charge subcircuit is being discharged depends primarily on the resistance of modulating resistor R$_m$ and discharge resistor R2$_t$, and the reverse breakdown voltages of diodes D1 and D2. As the resistance of discharge resistor R2$_t$ is reduced, the time during which the charge subcircuit is discharged will be reduced. If the variable resistors are manufactured the same and vary at the same rate in the wireless remote sensor 14, then the duty cycle (charging time vs. discharging time) will vary as a square function, providing greater measurement resolution to the inductive transmitter 12. The inductive transmitter 12 may also be able to determine coupling by measuring the change in coil current.

Figure 2:
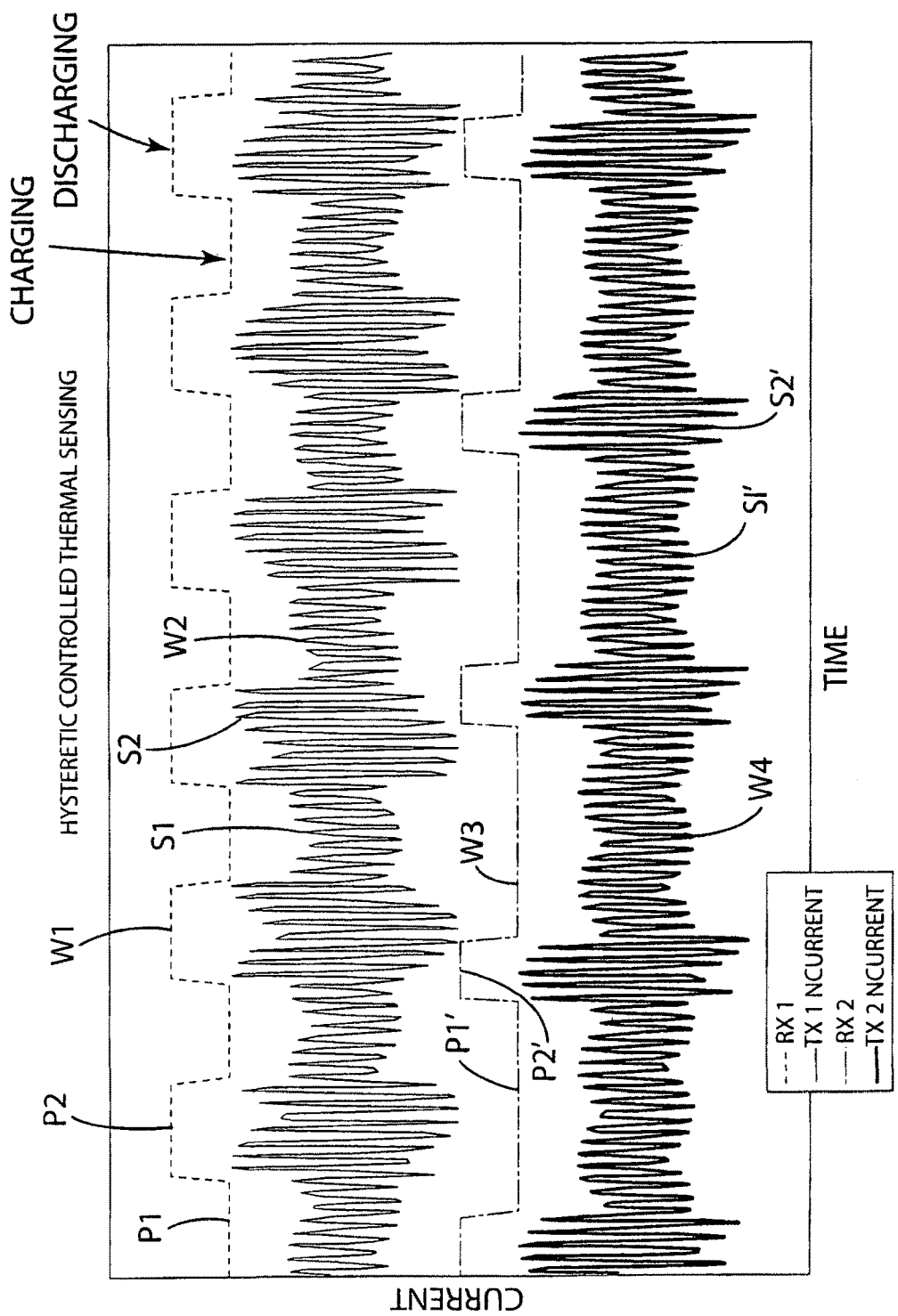
FIG. 2 is a diagram showing the current through the modulation resistor in two different wireless remote sensors and their associated inductive transmitters.

For example, FIG. 2 shows waveforms W1-W4 representing the oscillating wave produced by the charge/discharge circuit and the current in the transmitter coil in two different situations. The upper set of waveforms W1, W2 shows the oscillating wave with a duty cycle of approximately 50% and the lower set of waveforms W3, W4 shows the oscillating wave with a materially lower duty cycle. More specifically, the top waveform W1 represents the oscillating wave produced by the charge/discharge circuit in one situation. The second waveform W2 represents the current in the transmitter coil 16 as impacted by the oscillating wave W1 through reflected impedance. The lower set of waveforms shows the oscillating wave W3 and transmitter coil current W4 in a different situation. In this situation, the duty cycle is materially lower and the oscillating wave W3 and transmitter coil current W4 vary accordingly. As can be seen, the charge duration P1, P1' (i.e. the low portion of the oscillating wave) and the discharge duration P2, P2' (i.e. the high portion of the oscillating wave) vary from situation to situation, and this variance is readily detectable in the inductive transmitter 12 by watching transmitter coil current W2, W4 (or some other characteristic of power in the inductive transmitter 12 that is affected by the reflected impedance of the wireless remote sensor). In applications where the charge resistor R1$_t$ is sensor element 32, the value of the parameter sensed by sensor element 32 can affect the duration of the charge time. Similarly, in applications where the discharge resistor R2$_t$ is sensor element 34, the value of the parameter sensed by sensor element 34 can affect the duration of the discharge time. Accordingly, when all other factors remain constant, the value of sensor element 32 can be determined in the inductive transmitter 12 from the duration of the reduced amplitude portion S1, S1' in the transmitter coil current and the value of sensor element 34 can be determined in the inductive transmitter 12 from the duration of the increased amplitude portion S2, S2' in the transmitter coil current. By way of example, it may be determined that the value of sensor element 32 has increased and the value of sensor element 34 has decreased from the situation represented in the top waveforms W1, W2 to the situation represented in the bottom waveforms W3, W4. The amount of variation in the sensed values may be accurately determined by the specific duration of the reduced and increase amplitude portions, S1, S1', S2, S2'.

As noted above, the discharge subcircuit 38 may include a modulation leg 44 with a modulating resistor R$_m$. The modulation leg 44 may be configured so that transistor Q3 functions as an amplifier or as a switch depending on the value of the modulation resistor R$_m$. When transistor Q3 is functioning as an amplifier, a relative small change in discharge resistor R2$_t$ will cause a larger change in modulation amplitude and the discharge time of the charge/discharge circuit 30. The overall amplitude shift may be smaller because R$_m$ is a larger impedance. As a result, it may be easier for the inductive transmitter 12 to detect the value of the second sensor element R2$_t$ when transistor Q3 is operating as an amplifier.

When transistor Q3 is configured to be a current amplifier, the current flowing through modulating resistor R$_m$ is defined by the equation:

$$I_m = \beta 3 * I2$$

Where β3 is the gain of transistor Q3.

However, once the current reaches a threshold, transistor Q3 will be in saturation and will no longer amplify current. Rather, it will act as a constant voltage drop. Accordingly, in some applications, it may be desirable to set the value of modulating resistor R$_m$ so that the current does not reach the threshold at which transistor Q3 becomes saturated.

In the circuit of FIG. 1, the value of modulating resistor R$_m$ is defined by:

$$R_m = \frac{R2*(Vin-VCE3)}{\beta 3*(Vin-VD2-VCE2-VCE1)}$$

Where VD2 is the voltage drop across diode D2, and VCEx is the voltage drop across each transistor.

To operate transistor Q3 as a current amplifier, the value of R$_m$ is defined by:

$$R_m > \frac{R2*(VD1-VCE3)}{\beta 3*(VD1-VD2-VCE2-VCE1)}$$

As noted above, transistor Q3 still needs to be its amplifier mode when Vin is at its maximum. In this circuit, Vin is at its maximum when it equals VD1. As a result, it can be seen that modulating resistor R$_m$ needs to be greater than the threshold value to prevent the current from reaching its maximum.

As noted above, if transistor Q3 is acting as an amplifier, a small change in the sensed value of sensor element 34

(R2$_t$) will cause a larger increase in modulation amplitude, as well as change the discharge time of the charge subcircuit 36. The overall amplitude shift will be smaller because modulating resistor R$_m$ is a larger impedance To alternatively operate transistor Q3 as a switch, the value of modulating resistor R$_m$ is defined by:

$$R_m < \frac{R2*(VD2-VCE3)}{\beta 3*(-VCE2-VCE1)}$$

When Vin is at its minimum, it is equal to VD2. At this point, transistor Q3 still needs to be in saturation mode to continue to function as a switch. To ensure this, modulating resistor R$_m$ needs to be less than the threshold value to prevent the current from reaching its saturation threshold. If transistor Q3 is acting as a switch, a change in discharge resistor R2$_t$ will not cause a large increase in modulation amplitude, although it may still cause a slight change to the discharge time. The overall amplitude shift will be larger because modulating resistor R$_m$ is a lower impedance.

Figure 3:
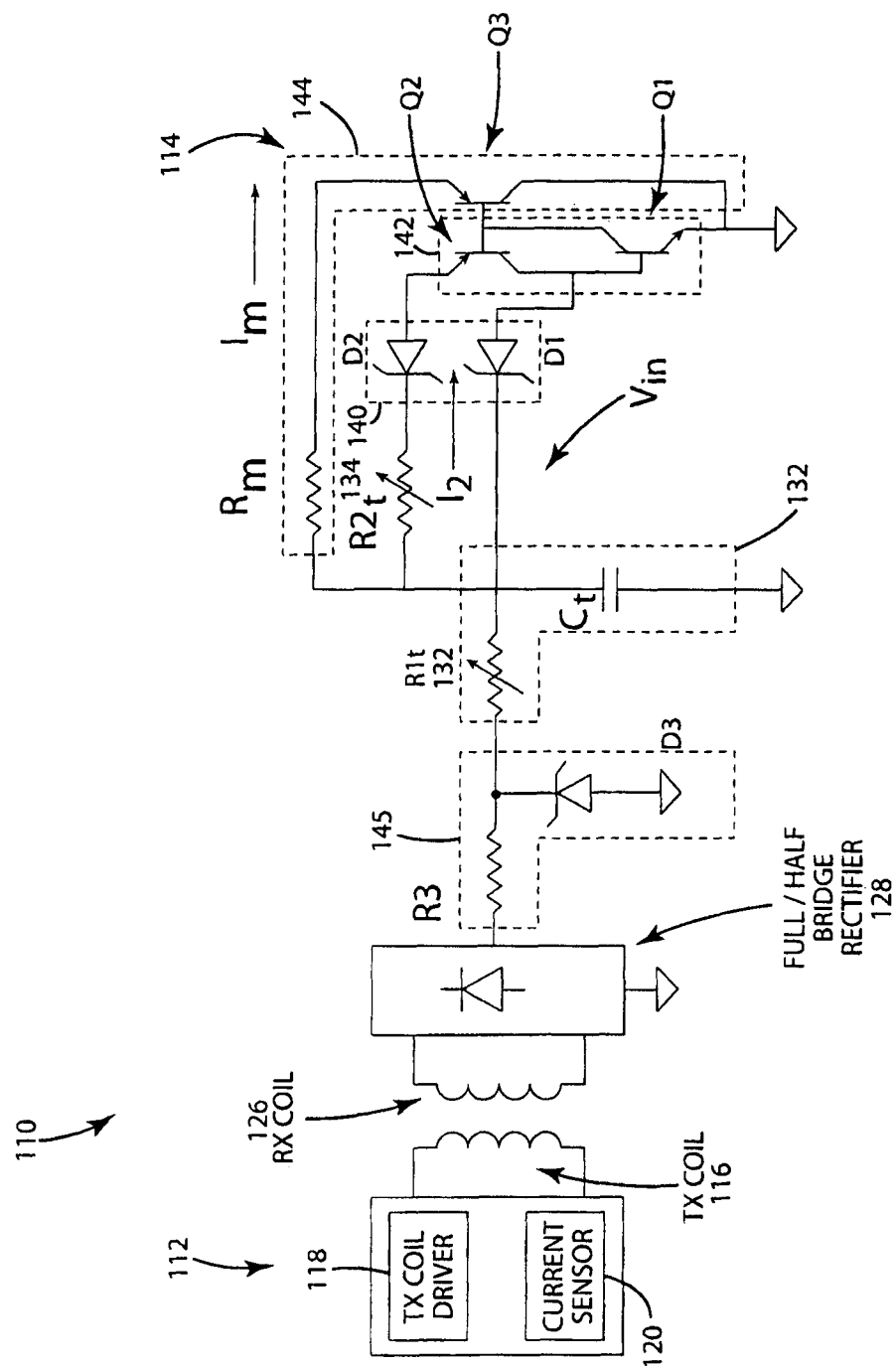
FIG. 3 is a schematic representation of an alternative system having an inductive transmitter and wireless remote sensor.

In some applications, there may be variations in the coupling coefficient between the inductive transmitter 12 and the wireless remote sensor 14. For example, variations in coupling may occur when the distance between or orientation of the inductive transmitter and the wireless remote sensor varies, or when metal items are situated in the electromagnetic field. Variations in coupling coefficient can affect the amount of power transmitted to the wireless remote sensor and therefore may affect the charge time of the charge/discharge circuit. For example, if the wireless remote sensor 14 is poorly coupled and receives less power, it may take longer for the charge subcircuit 36 to be charged enough to actuate the trigger 40 and begin discharge. As a result, poor coupling can cause variations in the oscillating wave. In applications where the coupling may vary, it may be desirable to implement a charge/discharge circuit that compensates for variations in coupling by normalizing the received voltage to a constant voltage reference. FIG. 3 is a schematic representation of an alternative wireless remote sensor system 110 in which the wireless remote sensor 114 includes a normalization subcircuit 145. In this alternative embodiment, the system 110 is essentially identical to system 10, except as shown or described. As an expedient, FIG. 3 includes reference letters and numerals that correspond with the reference letters and numerals of FIG. 1, except that the reference numerals are preceded by a "1". As can be seen, the normalization subcircuit 145 of this embodiment includes an additional resistor R3 and an additional zener diode D3 that function as a voltage clamp. Resistor R3 and diode D3 may alternatively be replaced by essentially any other type of constant voltage reference. By using a reference voltage to charge the charge subcircuit 132, the rate at which the charge subcircuit 132 charges is no longer dependent on coupling, assuming that the received voltage is higher that the reverse breakdown voltage of D3.

Figure 4:
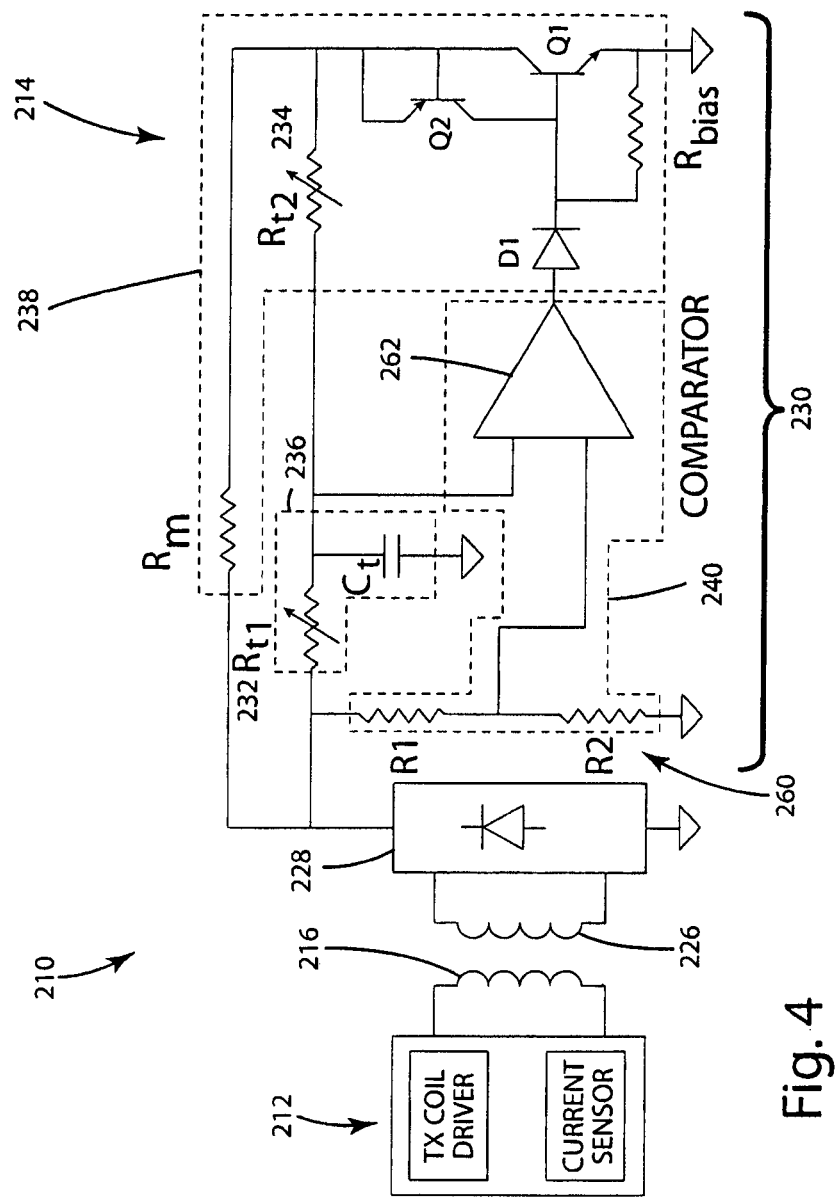
FIG. 4 is a schematic representation of a second alternative system having an inductive transmitter and wireless remote sensor.

FIG. 4 shows another alternative wireless remote sensor system 210 that is configured to prevent variations in coupling from producing changes in the charging time. In this embodiment, the system 210 generally includes an inductive transmitter 212 and a wireless remote sensor 214 having a receiving coil 226, a rectifier 228 and a charge/discharge circuit 230. The charge/discharge circuit 230 of this embodiment includes a charge subcircuit 236, a discharge subcircuit 238 and a trigger 240. In this embodiment, the trigger 240 is configured to compensate for variations in received power. More specifically, the trigger 240 is configured to eliminate or minimize variations through a voltage divider 260 and comparator 262 that are arranged so that the trigger point for transitioning from charging to discharging varies with the received voltage. As shown, the voltage divider 260 of this embodiment is connected between the rectifier 228 and the charge subcircuit 236, and it includes resistors R1 and R2. The comparator 262 includes two inputs that are connected to nodes on opposite sides of the charging subcircuit 232. For example, in this embodiment, one input is connected to the output of the voltage divider 260 and the other input is connected to a node between the charge subcircuit 236 and the discharge subcircuit 238. In this embodiment, the rate at which the charge capacitor C$_t$ is charged varies with the received voltage, but the reference voltage input into comparator 262 also varies with the received voltage. The values of these components are selected so that changes in charge rate are essentially offset by corresponding changes in the reference voltage of the comparator 262. As a result, the duration of the charge period remains essentially the same regardless of the received voltage. As a result, changes in the duration of the charge period will vary essentially only with changes in the sensor element 232 (R$_{t1}$), and the value of the sensed parameter can be determined in the inductive transmitter 212 from the duration of the low portion of the oscillating wave, as discussed above. In use, the trigger 240 operates based on a comparison of the voltage in the charge subcircuit 236 (largely the voltage in charge capacitor C$_t$) and the voltage of the output of voltage divider 260. More specifically, once the voltage in the charge subcircuit 236 has reached the same voltage as the output of the voltage divider 260, the comparator 262 enables the discharge subcircuit 238 by turning on the current latch (transistors Q1 and Q2) through diode D1. This current latch applies the modulating resistor R$_m$ and drains the charge capacitor C$_t$ through sensor element 234 R$_{t2}$. As soon as the modulating resistor R$_m$ is applied, the voltage in the charge subcircuit 236 falls below the comparator threshold, forcing the output of the comparator 262 low again. The diode D1 along with a bias resistor R$_{bias}$ prevent the gate of transistor Q1 from going low, allowing the current latch to continue to discharge the charge capacitor C$_t$ until the forward bias voltage of transistor Q1 is reached. Once reached, the latch turns off disabling the discharge subcircuit 238 and the charge subcircuit 236 begins its charging phase once again. In this embodiment, the value of resistor R$_{t2}$ will affect the time required for the charging capacitor C$_t$ to discharge, and therefore will directly affect the duration of the discharge period. Accordingly, the value of the parameter sensed by the second sensor element 234 (R$_{t2}$) can be determined in the inductive transmitter 212 from the duration of the high portion of the oscillating wave, as discussed above.

Figure 18:
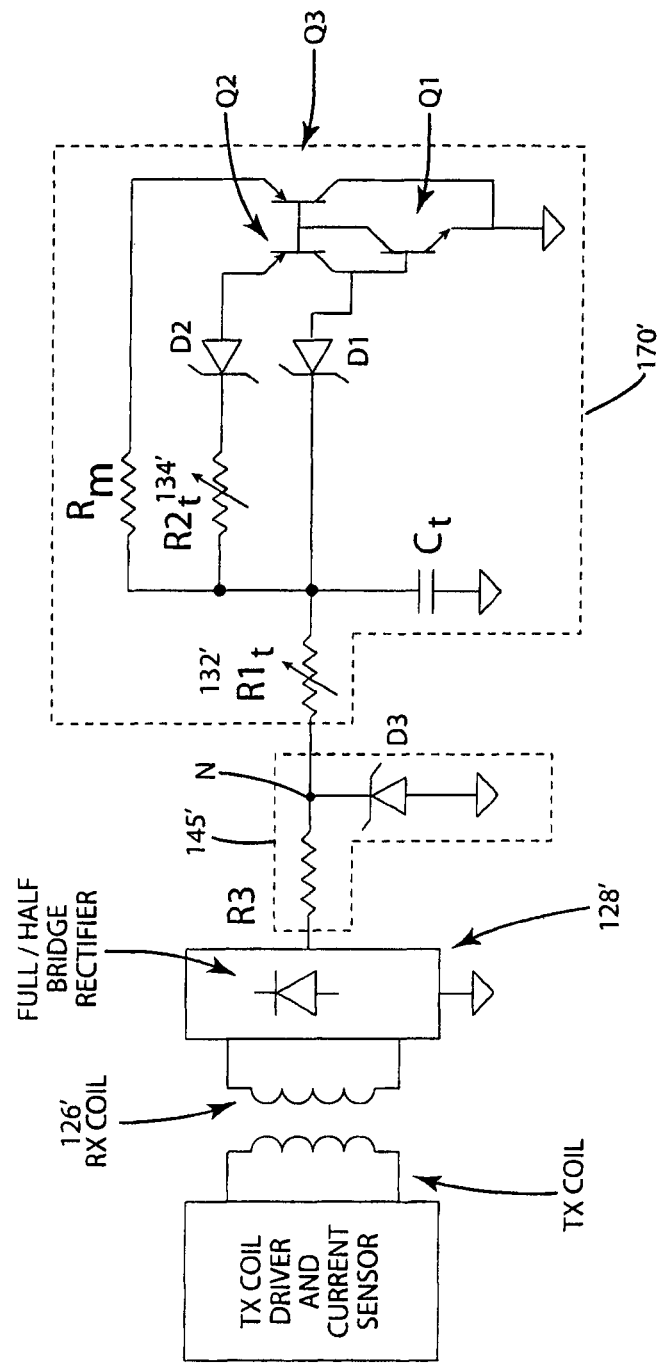
FIG. 18 is similar to FIG. 3, and shows an example of a voltage controlled oscillator that uses a latch-type oscillation.
Figure 20:
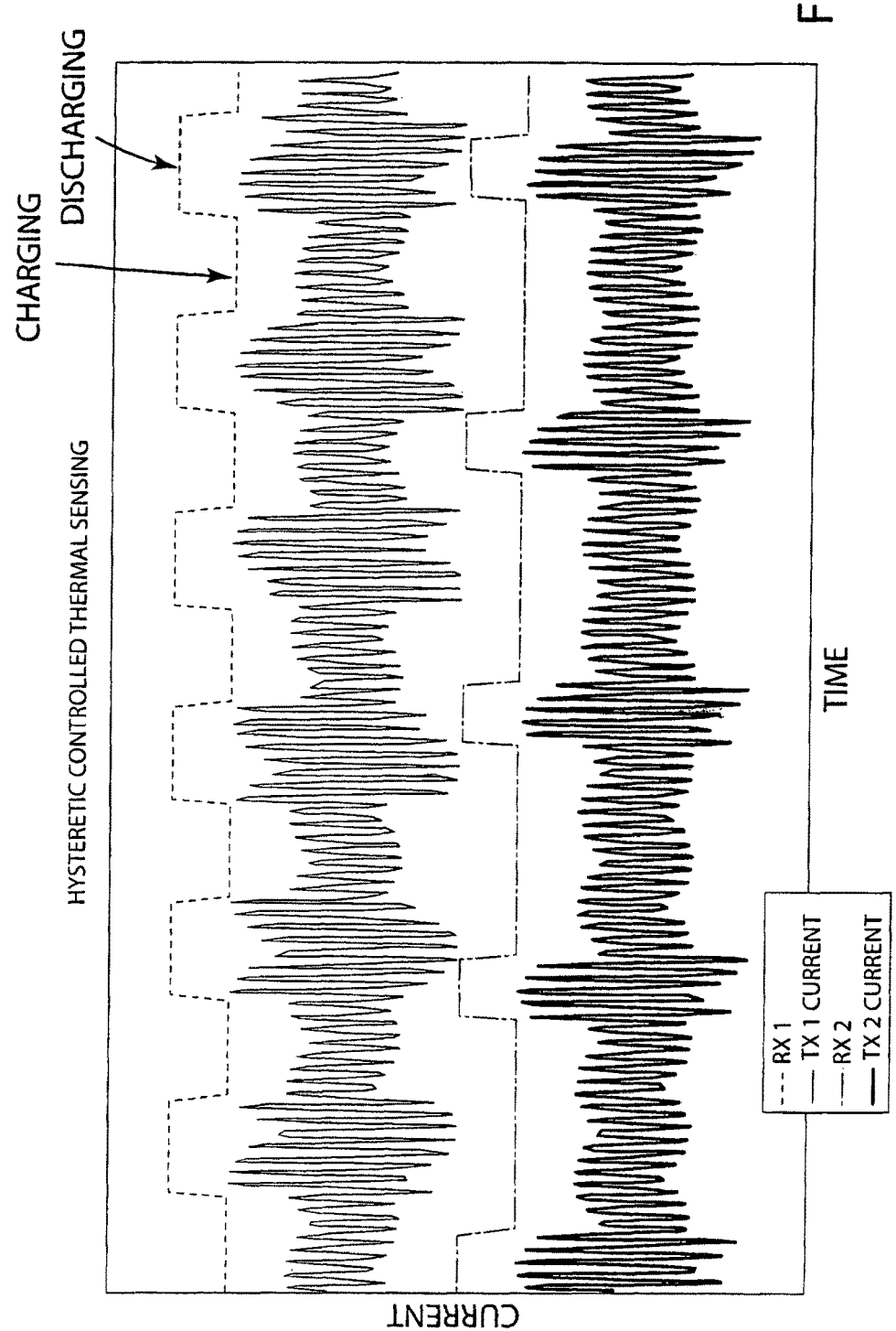
FIG. 20 is an example of the waveforms created by the VCO.

In alternative embodiments of the present invention, the wireless remote sensor system may use a voltage controlled oscillator ("VCO") to generate an oscillating wave. The VCO may be coupled to a variable impedance element such that variations in the value of the variable impedance element result in variations in the oscillation frequency of the VCO. One embodiment of a VCO-type wireless remote sensor system 10' is shown in FIG. 18. As can be seen, the wireless remote sensor system 10' of FIG. 18 is essentially identical to that of FIG. 3, except that select circuit elements of FIG. 3 are incorporated into the VCO 170' of FIG. 18. The wireless remote sensor system 10' generally includes a receiving coil 126', a rectifier 128', a normalization subcircuit 145' and the VCO 170'. The VCO 170 includes all of the circuit components to the right of node N. In this embodiment, the sensor elements 132' and 134' may be variable impedance elements (such as the illustrated variable resistors) that affect the oscillation characteristics of the VCO 170', and consequently affect the signal that is received in the transmitter coil by reflected impedance. As can be seen, FIG. 18 demonstrates how the circuitry of FIG. 3 can be characterized as providing a VCO-type wireless remote sensor system. FIG. 20 is an example of the type of output waveform that may be provided by a VCO-type wireless remote sensor system. As can be seen, FIG. 20 is identical to FIG. 2 and demonstrates that a VCO-type wireless remote sensor system may, if configured to do so, be capable of providing essentially the same types of waveforms discussed above.

Figure 19:
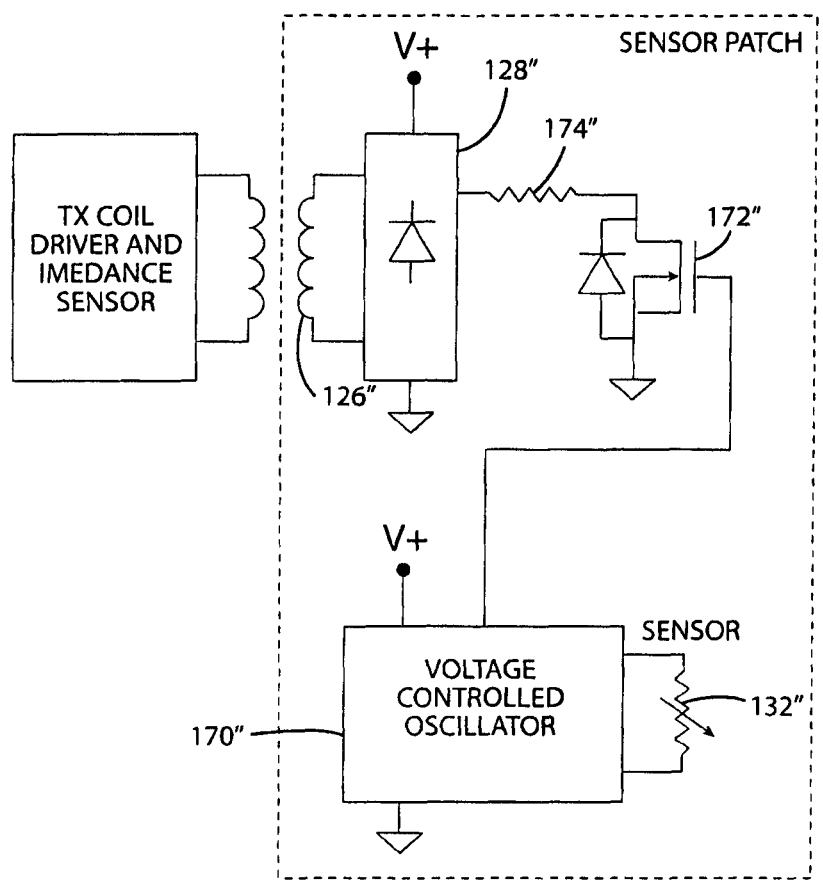
FIG. 19 is a schematic representation of a general voltage controlled oscillator (VCO) that uses a buffered output that modulates the load on the receiver.

An alternative embodiment of a VCO-type wireless remote sensor system 10" is shown in FIG. 19. In this embodiment, the wireless remote sensor system 10" uses a VCO 170" coupled to a variable impedance element 132". The variable impedance element 132" changes the output frequency of the VCO 170", and may be a variable resistance, capacitance, inductance. Additionally, the variable impedance element 170" may be a semiconductor such as a diode or transistor wherein the varying properties of the P-N junction are sensed as a change in impedance or voltage. This signal is then buffered to convert it from a sine wave to a square wave. In this embodiment, the output of the VCO 170" is applied to the gate of MOSFET 172", which is used to convert the sine wave output by the VCO 170" to a square wave, and also applies a modulating load 174" to the rectifier 128". A voltage offset may also be used to vary the threshold at which MOSFET 172" turns on. For example, a variable impedance element (not shown) may be used to control the reference. If this offset is controlled by a variable impedance element, this element will then vary the duty cycle of the modulation. This is due to the fact that as the offset voltage rises, the portion of the sine wave above the threshold value decreases, though the frequency remains the same. This reduces the duty cycle of the signal, providing additional information back to the base sensor. More specifically, with this alternative embodiment, the value of variable impedance element 132" can be determined by the frequency of the signal and the value of the variable impedance element that controls the voltage offset can be determined by the duty cycle of the signal. As an alternative to the embodiment of FIG. 19, the output of the VCO 170" may directly drive a load, may be filtered, amplified, buffered, or use any other form of typical signal conditioning to provide an appropriate signal.

Figure 21:
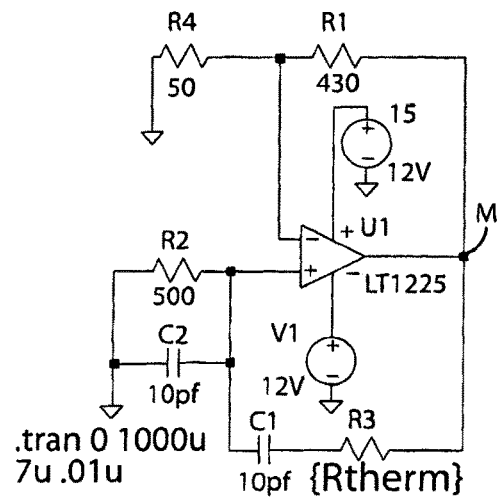
FIG. 21 is an example of a voltage controlled oscillator that uses a variable impedance element to vary the frequency of oscillation.
Figure 26:
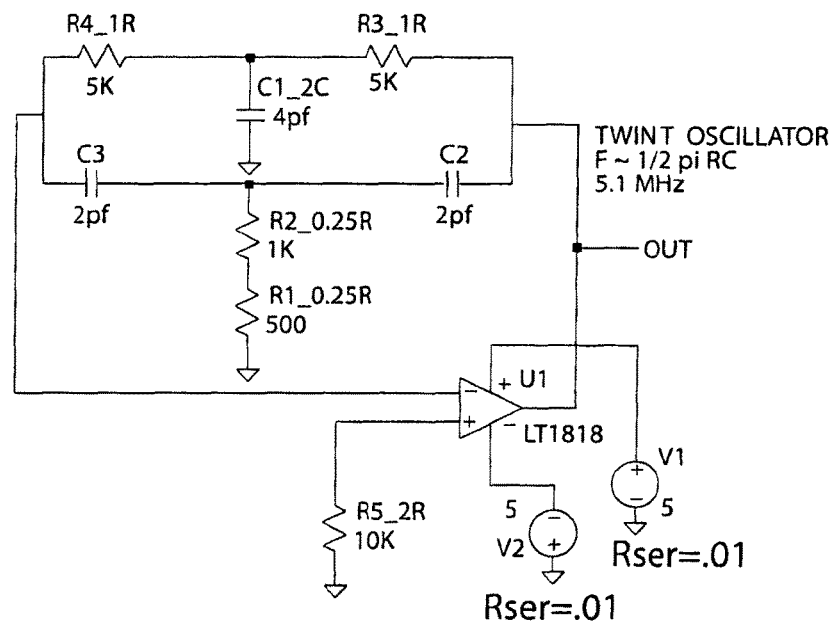
FIG. 26 shows an alternative example of a VCO.
Figure 27:
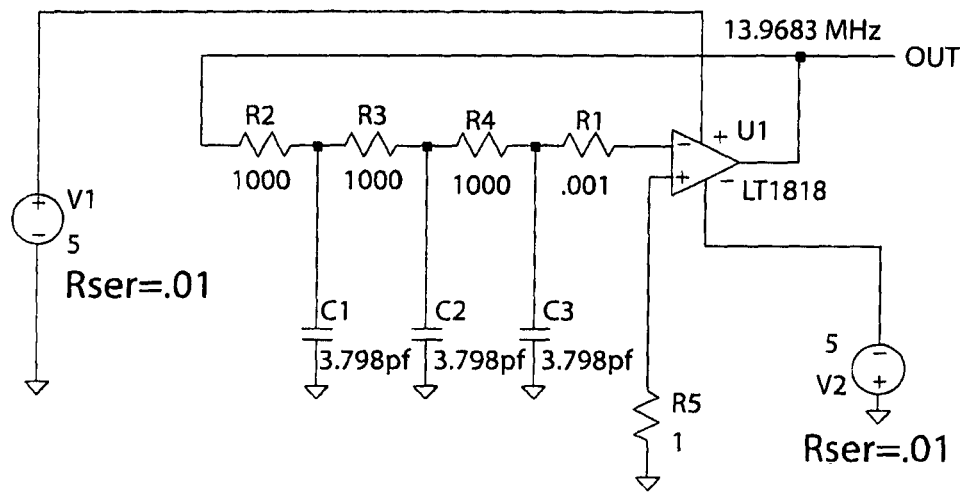
FIG. 27 shows an alternative example of a VCO.

The present invention may be implemented with essentially any type of VCO. Examples of VCOs that may be used are shown in FIGS. 21, 26, and 27. In FIG. 21, a Wienbridge oscillator with a variable impedance element R3 is used to produce a sine wave that varies its frequency based on the changes in the impedance of R3. A Twin T Oscillator is shown in FIG. 26 wherein the resistors R3 and R4, along with the capacitor C1, are varied to vary the output frequency of the oscillator. A Phase-shift oscillator is shown in FIG. 27, wherein the resistors R2, R3, or R4 may be used along with C1, C2, and C3 to vary the output frequency of the oscillator. In addition to VCOs, the present invention may be implemented using essentially any type of oscillator, and the characteristics of oscillation (such as frequency or amplitude) may be controlled by a sensor presenting variations in resistance, impedance, capacitance and/or inductance. These and other oscillators may be more fully understood by reference to "Practical Solid-State Circuit Design" by Jerome E. Oleksy, 1974, which is incorporated herein by reference in its entirety.

An alternative aspect of the present invention is shown in FIGS. 5-10. In this embodiment, the wireless remote sensor system 310 includes a wireless remote sensor 314 that incorporates a Wheatstone bridge arrangement 370 with an internal resonant circuit 372 that generates an electromagnetic field representative of the value of one or more sensed parameters. In this embodiment, the electromagnetic field generated by the internal resonant circuit 372 can be received and analyzed in the inductive transmitter 312 via a separate sense coil 374 to determine the value of the sensed parameter(s). In use, the Wheatstone bridge arrangement 370 is configured to cause current to flow in the internal resonant circuit 372 based on the value of a sensor element 332 incorporated into the Wheatstone bridge arrangement 370. As a result, the wireless remote sensor 314 produces an electromagnetic field having characteristics that represents the sensed value or values.

Figure 5:
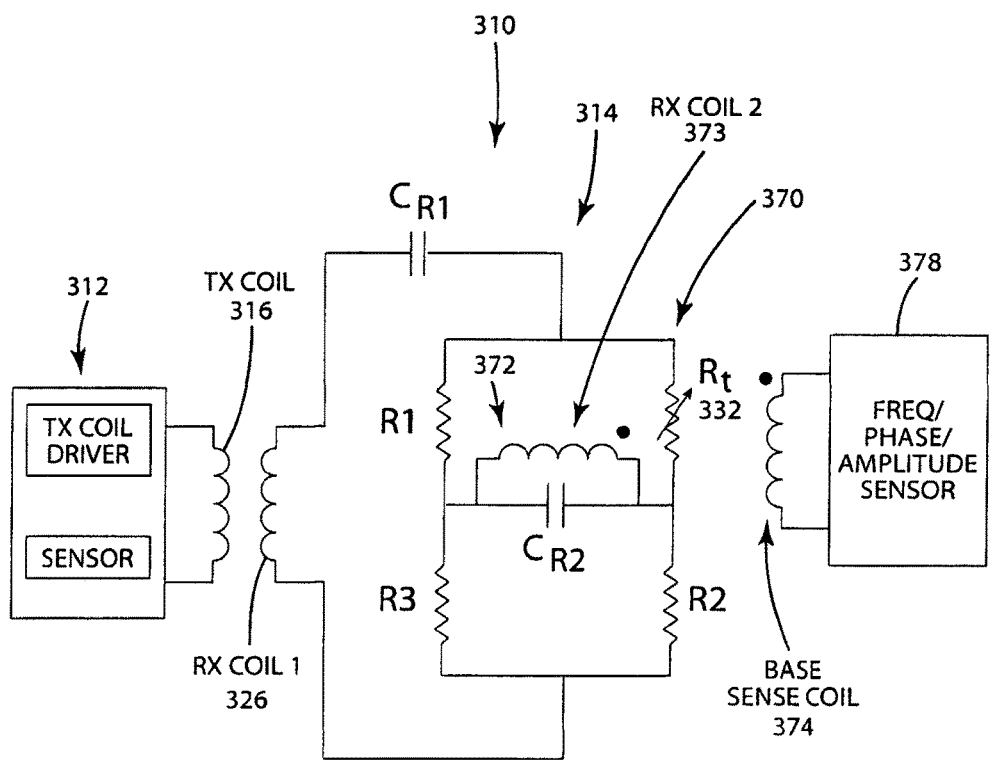
FIG. 5 is a schematic representation of a wireless remote sensor system having a wireless remote sensor with a Wheatstone bridge arrangement in accordance with a second aspect of the present invention.

FIG. 5 shows an embodiment in which the wireless remote sensor 314 uses a first receiving coil 326 to energize a Wheatstone bridge arrangement 370 that utilizes 2 pairs of matched resistors (R1 and $R_t$, R2 and R3), wherein resistor $R_t$ is a sensor element 332 having a variable resistance that varies with the value of the sensed parameter. For example, resistor $R_t$ may be a thermistor when wireless remote sensor 314 is configured to measure temperature. By utilizing a variable resistance in a Wheatstone bridge arrangement, the voltage across the internal resonant circuit 372 created by capacitor $C_{R2}$ and internal coil 373 (RX coil) will vary with the value of the variable resistor $R_t$. As the resistance of resistor $R_t$ increases, the voltage induced across the internal resonant circuit 372 will cause current to flow in the internal coil 373. This current flow generates an electromagnetic field that can be received by a sense coil 374 and its characteristics can be measured by a sensor 378 coupled to sense coil 374. The sense coil 374 may be located in the inductive transmitter 312 or in another location where wireless detection of the sensed parameter is desired. Although not shown, the sense coil 374 may be coupled with a capacitor to provide a resonant tank circuit. Additionally, if the resistance of resistor $R_t$ decreases, then the voltage induced across the internal resonant circuit 372 will cause current to flow in the internal coil 373, but in the opposite phase as the receiving coil 326. This phase difference can be detected by comparing the phase of the current in the transmitter coil 316 and the sense coil 374. If the resistance of resistor $R_t$ matches that of resistor R1, then no voltage will be induced across the internal resonant circuit 372, and no current will flow through the internal coil 373.

It should be noted that the internal coil and sense coil may very poorly coupled to the transmitter coil 316 and the receiving coil 326, so as to be able to sense low levels of current without interference from the magnetic field created used to wirelessly transmit power from the inductive transmitter 312 to the wireless remote sensor 314. For example, the internal coil 373 and sense coil 374 may be located away from the transmitter coil 316 and the receiving coil 326. As another example, the internal coil 373 and sense coil 374 may be arranged orthogonal to the transmitter coil 316 and the receiving coil 326.

To provide improved performance in typical applications, the internal coil 373 and internal capacitor $C_{R2}$ can be tuned to the same frequency as the receiving coil 326 and receiving capacitor $C_{R1}$, or can be tuned to a different frequency such as a harmonic. By doing so, the inductive transmitter 312 can apply a signal with multiple frequencies—such as a square wave, sawtooth wave, or a carrier wave with a modulated signal on top of the carrier—and read the frequency components in the sense coil 374 associated with the resonant frequency of the internal resonant circuit 372.

Figure 6:
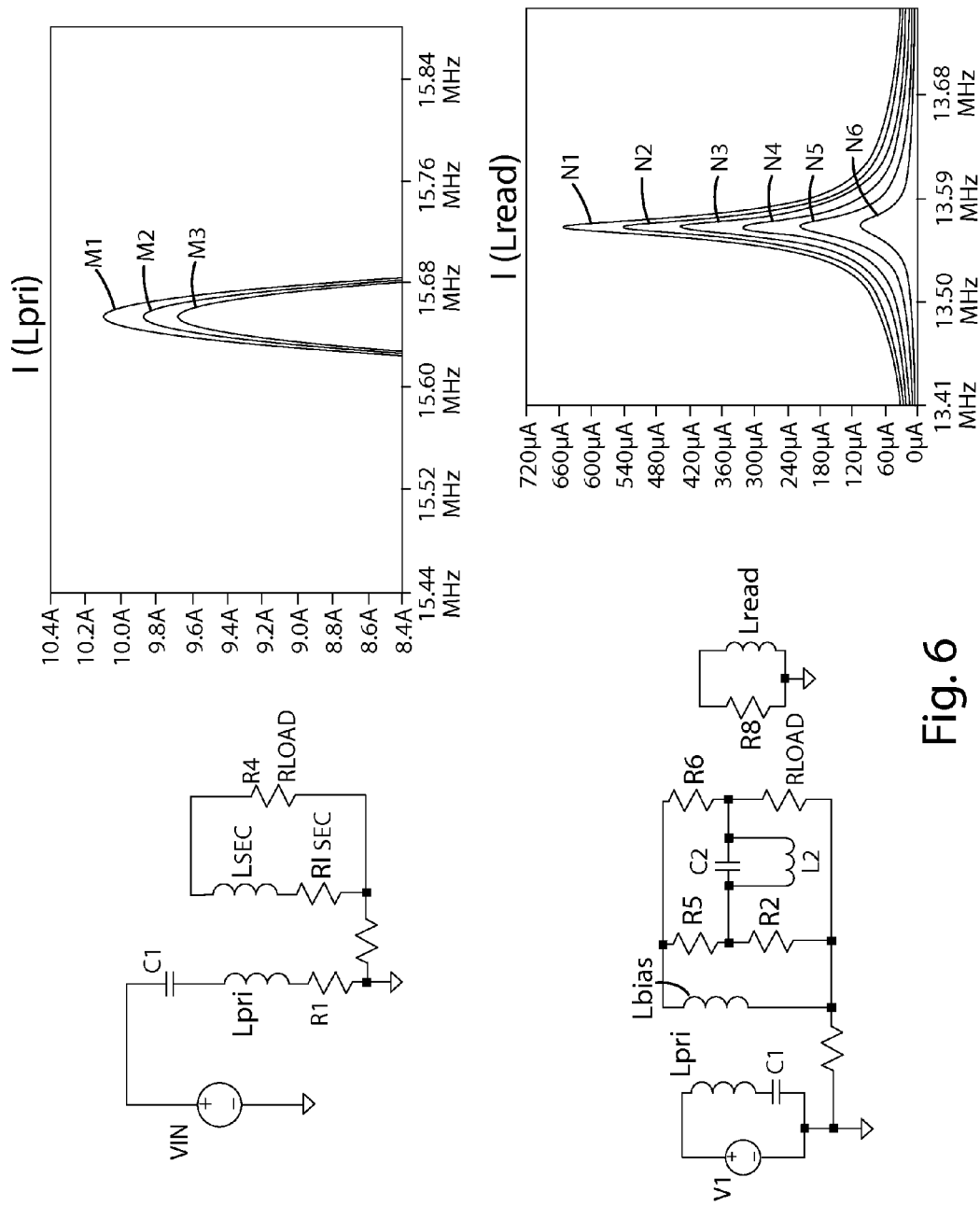
FIG. 6 shows circuit diagrams and simulations comparing a traditional method of remote temperature sensing with a Wheatstone bridge arrangement in accordance with an embodiment of the present invention.

FIG. 6 shows circuit diagrams and simulations comparing a traditional wireless remote temperature sensor (as shown in the upper diagram and simulation) with a wireless remote temperature sensor 314 in accordance with the system of FIG. 5 (as shown in the lower diagram and simulation). The upper simulation presents three current measurements M1, M2, M3 taken with 0.5% changes in the resistance value of a sensor element. As can be seen, a 0.5% change in resistance results in an about 0.2 amp change in current, which amounts to about a 2% change in current amplitude. The lower simulation presents five current measurements N1, N2, N3, N4 and N5 taken with 0.1% changes in the resistance value of a sensor element. In this simulation, the % change in current is significantly greater. For example, the % change between the peak value of N1 is more than 600% greater than the peak value of N5. As a result, it can be seen that small changes in resistance are more difficult to detect in the upper simulation, and much easier to detect in the lower simulation.

Figure 7:
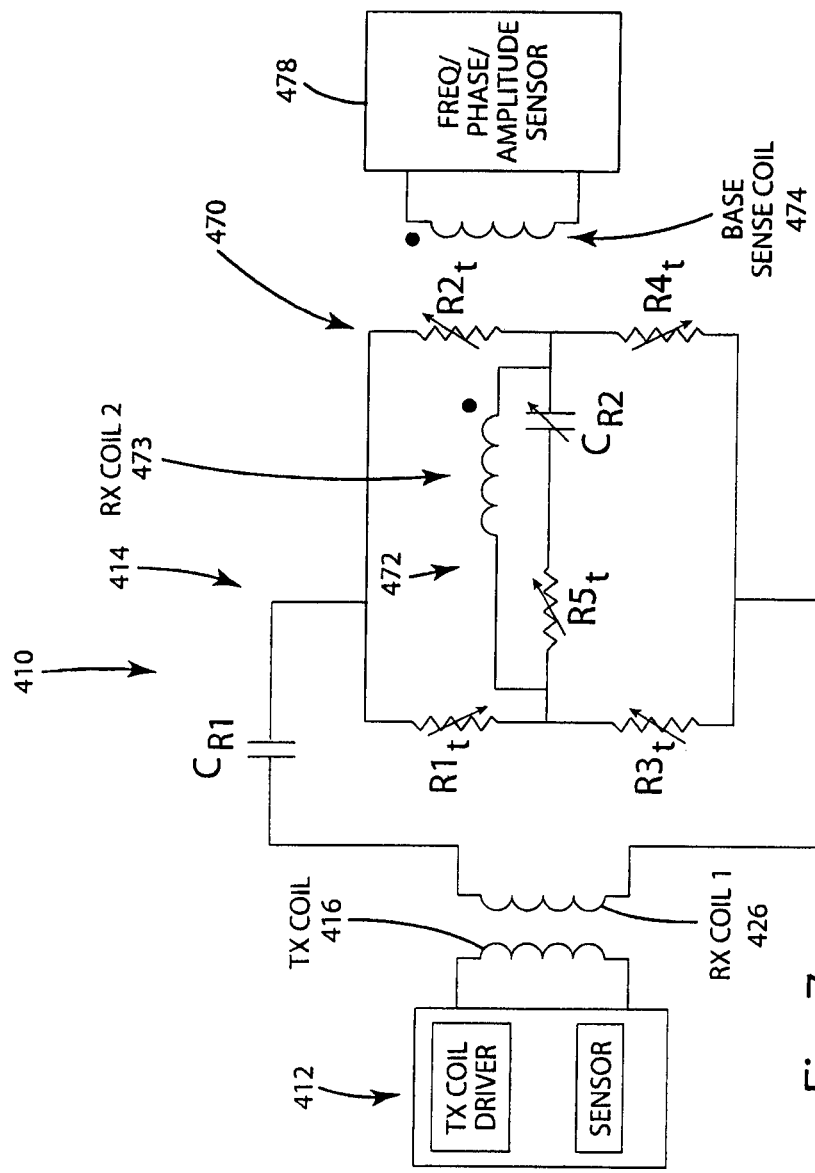
FIG. 7 is a schematic representation of a fourth alternative system having an inductive transmitter and wireless remote sensor with a Wheatstone bridge arrangement.

An alternative embodiment of the wireless remote sensor system 410 having a wireless remote sensor 414 with a Wheatstone bridge arrangement 470 is shown in FIG. 7. In this embodiment, the AC Wheatstone bridge arrangement 470 includes additional variable impedance elements that can be used to further affect the electromagnetic field generated by the internal resonant circuit 472. The wireless remote sensor system 410 of this embodiment is essentially identical to the wireless remote sensor system 310, except as shown or described. As an expedient, FIG. 7 includes reference letters and numerals that generally correspond with the reference letters and numerals of FIG. 5, except that the reference numerals are preceded by a "4" instead of a "3". In this embodiment, the internal capacitor $C_{R2}$ is a variable capacitor, which can vary the resonant frequency of the internal resonant circuit 472. In one embodiment, the internal capacitor $C_{R2}$ may be a sensor element that has a variable capacitance that varies with the parameter to be sensed. For example, the internal capacitor $C_{R2}$ may be a capacitor with a dielectric material having a dielectric constant that varies with temperature. Further, in this embodiment, there are additional variable resistances in the Wheatstone bridge arrangement 470. For example, each resistor may be a sensor element having a resistance that varies with the parameter to be measured, such as temperature. In the embodiment shown, resistors $R1_t$ and $R4_t$ are the same material, meaning they vary at nearly the same rate and in the same direction as one another. Additionally, in this embodiment, resistors $R2_t$ and $R3_t$ are made of the same materials as one another, but vary in the opposite direction as resistors $R1_t$ and $R4_t$. As such, the two resistor pairs cooperate to increase the impact of variations in the sensed parameter. This increases the resolution of the system because for every 1% change in any single resistance value, the overall voltage difference across the internal resonant circuit 472 increases by a factor of 4. Further, a variable resistor ($R5_r$) could be added to the internal resonant circuit 472 to vary the Q of the internal resonating circuit 472, which could also be sensed by the sense coil 476.

Figure 8:
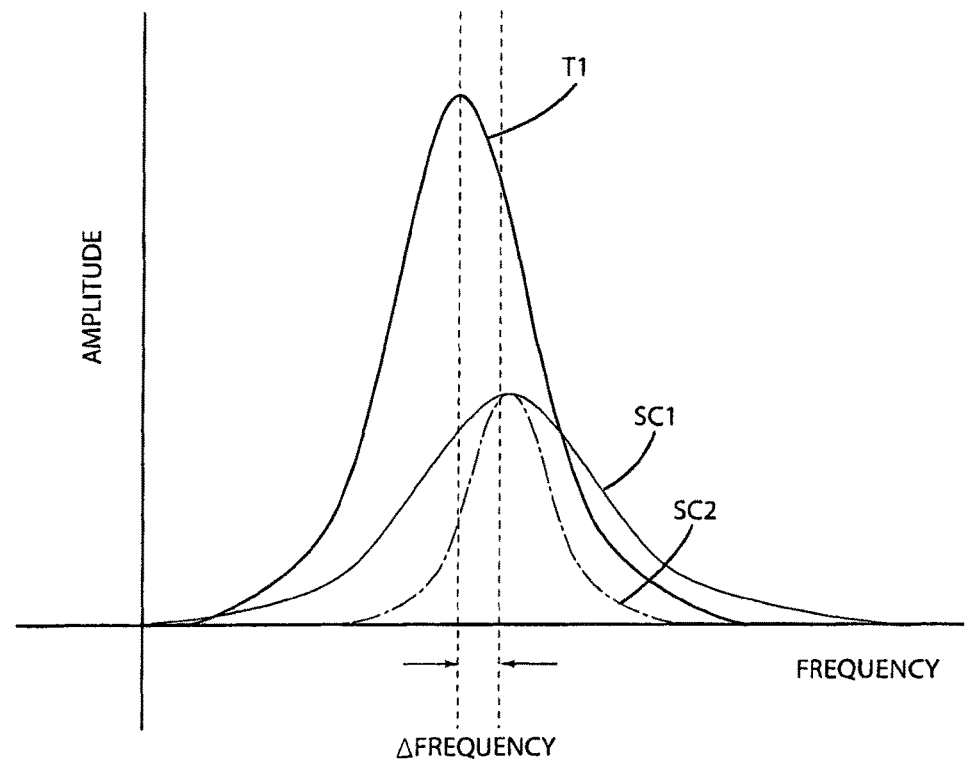
FIG. 8 is a diagram showing the currents in the transmitter coil and the base sense coil under different circumstances.

FIG. 8 shows the currents in the transmitter coil 416 and the sense coil 476 where there have been various changes in the wireless remote sensor 414. In this illustration, curve T1 represents the current in the transmitter coil 416, curve SC1 represents the current in sense coil 476 when internal resistor $R5_r$ has a first value and SC2 represents the current in the sense coil 476 when internal resistor $R5_r$ has a second value. In this embodiment, it can be seen from a comparison of T1 with SC1 and SC2 that the resonant frequency has been shifted. In this embodiment, the resonant frequency has been shifted by a change in internal capacitor ($C_{R2}$). Additionally, the Q has varied from SC1 to SC2 due to a change in resistance of internal resistor $R5_r$. Although not shown, the amplitude of the sensed current can be shifted to show a change in the variable resistive bridge formed by resistors ($R1_t$, $R2_t$, $R3_t$ and $R4_t$). As can be seen, changes in one or more of the variable impedance elements contained in the wireless remote sensor 414 are reflected in the current sensed in the sense coil 476. Although described in connection with a current sensor, these changes may alternatively be determined by measuring other characteristics of power in the sense coil 476, such as frequency, voltage, power and/or phase.

Figure 9:
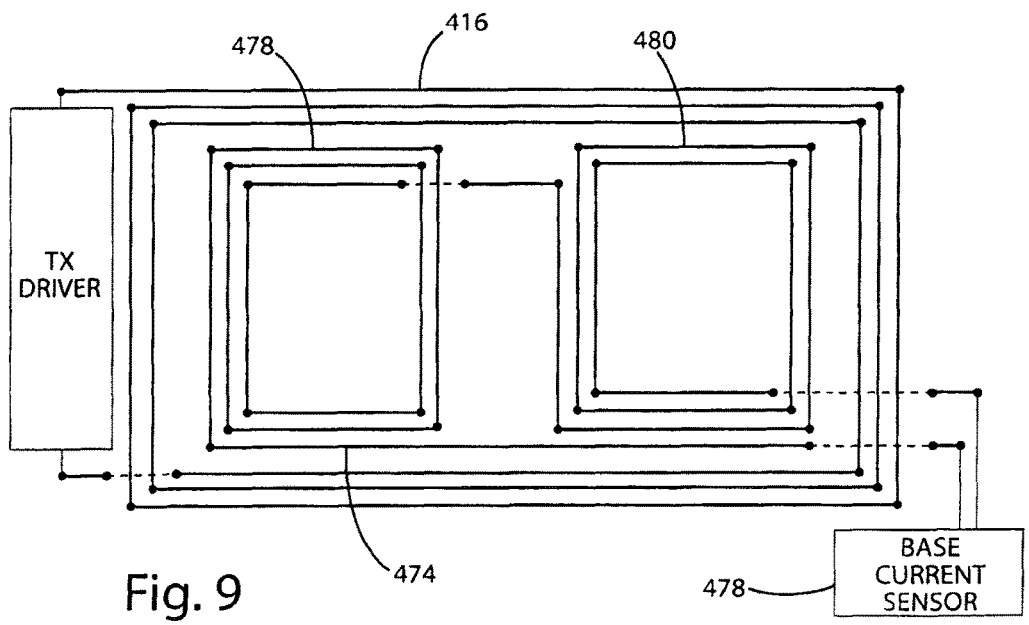
FIG. 9 is a schematic representation of a transmitter coil and base sense coil in accordance with an embodiment of the present invention.
Figure 10:
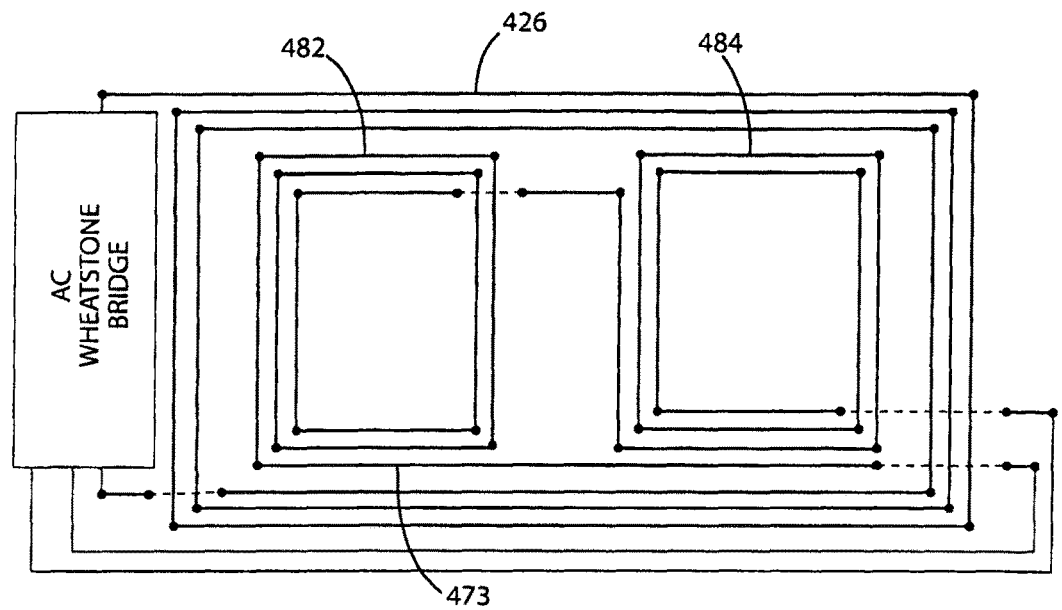
FIG. 10 is a schematic representation of a receiving coil and an internal coil.

The power transfer coils (e.g. transmitter coil 416 and receiving coil 426) and feedback coils (e.g. internal coil 473 and sense coil 474) may be configured to minimize interference between the two coil sets. In the embodiment of FIGS. 9-10, the power transfer coils 416, 426 are arranged outside the feedback coils 473, 474, and the feedback coils are arranged in a counter-wound configuration. As shown in FIG. 9, the transmitter coil 416 and sense coil 474 are arranged in close proximity. For example, both coils may be incorporated into the inductive transmitter 412. In this embodiment, the transmitter coil 416 is a spiral wound coil having an internal space configured to receive the sense coil 474. The sense coil 474 of this embodiment includes two coil portions 478, 480 that are wound in opposite directions. The two coil portions 478, 480 may be generally identical in terms of size, shape and configuration so that they are roughly symmetrical and receive approximate equal but opposite affect from the power transfer coils 416 and 426. Referring now to FIG. 10, the receiver coil 426 is a spiral wound coil having an internal space configured to receive the internal coil 473. The internal coil 473 of this embodiment includes two coil portions 482, 484 that, like the sense coil 476, are wound in opposite directions. The two coil portions 482, 484 may be generally identical in terms of size, shape and configuration so that they are roughly symmetrical and receive approximate equal but opposite affect from the power transfer coils. In this embodiment, the power transfer coils and feedback coils are intended to be placed directly adjacent to one another with the corresponding coils extending roughly coextensively with one another. As a result, the corresponding coils have essentially the same size, shape and configuration. More specifically, in this embodiment, the transmitter coil 416 and receiver coil 426 are generally rectangular coils having essentially the same size and shape. Similarly, the sense coil 474 and internal coil 473 are both counter-wound coils with coil portions of essentially the same size and shape. Because of the counter-wound nature of feedback coils, the current induced by the power transfer coils will essentially cancel out as measured by the current sensor 478 coupled to the sense coil 474. However, because of the physical proximity between the counter-wound portions of the sense coil 474 and the internal coil 373, the magnetic field from the internal coil 473 will be effectively communicated to the sense coil 474. The coils arrangements shown in the illustrated embodiment are merely exemplary. The coils may vary in size, shape and configuration from application to application. For example, the feedback coils 473, 474 need not be located within the power transfer coils 416, 426. Instead the coil sets can be separated to further minimize interference from the power transfer coils.

Although described in connection with a wireless remote sensor 414, this coil configuration can also be used in other applications where it is desirable to position two sets of coils in close proximity with minimized interference. For example, this coil arrangement may be used in other applications where it is desirable have a first set of coils for transferring power and a second set of coils for transmitting signals, data or other types of information.

Figure 11:
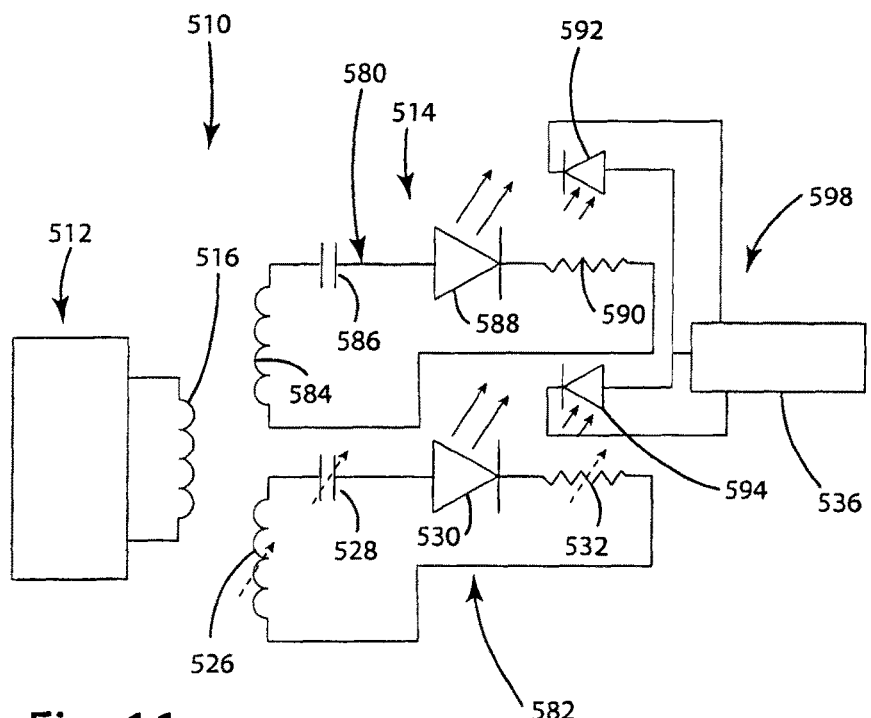
FIG. 11 is a schematic representation of a wireless remote sensor in accordance with a third aspect of the present invention.

In another aspect, the present invention provides a wireless remote sensor system 510 that incorporates an optical feedback network having a reference LED and one or more sensor LEDs. In the embodiment of FIG. 11, the wireless remote sensor system 510 generally includes an inductive transmitter 512, a wireless remote sensor 514 and an optical sensor network 598. The optical sensor network 598 may be positioned in the inductive transmitter 512 or may be located remotely, if desired. In summary, the wireless remote sensor 514 receives power from the inductive transmitter 512 and provides optical feedback that is representative of the value(s) of one or more parameters. To allow the system to compensate for variations in coupling and other changes that should be factored out, such as circuit drift, the wireless remote sensor 514 includes a reference circuit 580 and a sensor circuit 582. The reference circuit 580 includes fixed components so that its reference LED 588 varies in intensity only with changes in received power (e.g. changes in coupling) and other changes, such as circuit drift over time, that should be factored out when determining the value of the sensed parameter. The sensor circuit 582 includes at least one variable impedance element that is configured so that the sensor LED 530 varies in intensity based on the value of the variable impedance element, as well as with received power. The optical sensor network 598 separately senses the intensity of reference LED 588 and sensor LED 530, and the sensed values are used to determine the value of the sensed parameter. Because the reference LED 588 varies only with changes in coupling and other changes, such as circuit drift, that should be factored out of the sensor LED 530 intensity, the reference LED 588 can be used to isolate the difference in the intensity of the sensor LED 530 caused by the variable impedance element from those caused by changes in coupling and other factors not related to variations in the variable impedance element, such as circuit drift. For example, in some applications, the LEDs may naturally decay over time and therefore have an inherent reduction in brightness over time. Given that the reference LED 588 and sensor LED 530 should undergo roughly the same natural decay over time, the reference LED 588 can be used to factor out LED decay from the intensity of the sensor LED 530. LED decay is only one example of a factor that can lead to circuit drift over time. Circuit drift over time may result from other factors, such as changes in power supply voltage, sensitivity of detection optics and decay/degradation of circuit components.

As noted above, the wireless remote sensor 514 includes reference circuit 580 and a sensor circuit 582. The number of sensor circuits may, however, vary from application to application as desired. For example, when it is desirable for the wireless remote sensor 514 to sense the value of two different parameters, it may be provided with second sensor circuit (not shown) having a sensor LED that varies in intensity with the value of the sensed parameter. For example, the second sensor circuit may include a variable impedance element having an impedance that varies with the parameter to be sensed. Referring again to FIG. 11, the reference circuit 580 of this embodiment incorporates a series resonant tank circuit for receiving power from the inductive transmitter 512. The tank circuit may include a receiver coil 584 and a receiver capacitor 586. The reference circuit 580 of this embodiment also includes a reference LED 588 and a reference resistor 590. In use, the intensity of the reference LED 588 varies with changes in the amount of power received from the inductive transmitter 510. As the coupling varies between the inductive transmitter 510 and the reference circuit 580, the reference LED 588 will vary in intensity. This variation in intensity can be measure remotely (e.g. from the inductive transmitter 510) via an optical sensor, such as sensor 592.

The sensor circuit 582 is similar to the reference circuit 580 in that it also includes a series resonant tank circuit having a receiver coil 526 and a receiver capacitor 528, a sensor LED 530 and a resistor 532. However, in the sensor circuit 582, one or more of the receiver coil 526, receiver capacitor 528 and resistor 532 can be a variable impedance element that is configured to vary with changes in the value of the sensed parameter. For example, resistor 532 may be a thermistor having a resistance that varies with temperature. Further, the receiver coil 526 may be a variable inductor and/or the receiver capacitor 528 may be a variable capacitor. As a result, the intensity of the sensor LED 530 with vary not only with changes in the received power, but also with changes in the variable impedance element(s). The intensity of the sensor LED 530 can be measure remotely (e.g. from the inductive transmitter 510) via an optical sensor, such as sensor 594.

In this embodiment, the variation in intensity of the sensor LED 530 resulting from changes in the variable impedance element(s) can be isolated from variations caused by changes in coupling and circuit drift over time by using the reference LED 588. More specifically, the detected change in the intensity of the reference LED 588 can be removed from the detected changes in the intensity of the sensor LED 530 to effectively eliminate changes caused by the coupling and circuit drift over time, thereby isolating the changes caused by variations in the variable impedance element(s). For example, variations in the intensity of reference LED 588 measured by optical sensor 592 can be subtracted from variations in the intensity of sensor LED 530 measured by optical sensor 594.

Figure 12:
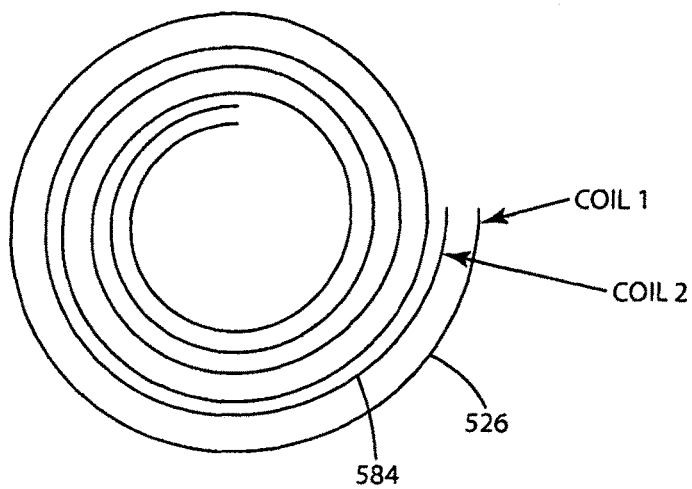
FIG. 12 is a schematic representation of two receiving coils of the wireless remote sensor of FIG. 11.
Figure 13:
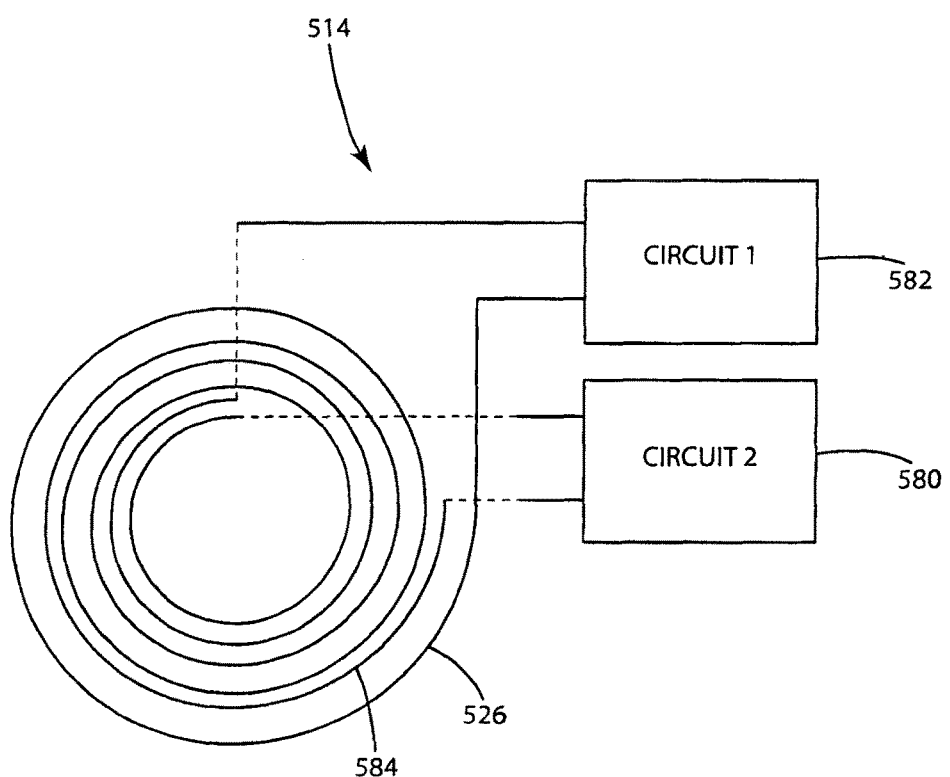
FIG. 13 is a schematic representation of the two receiving coils of FIG. 12 connected to the reference and sensor circuits.
Figure 14:
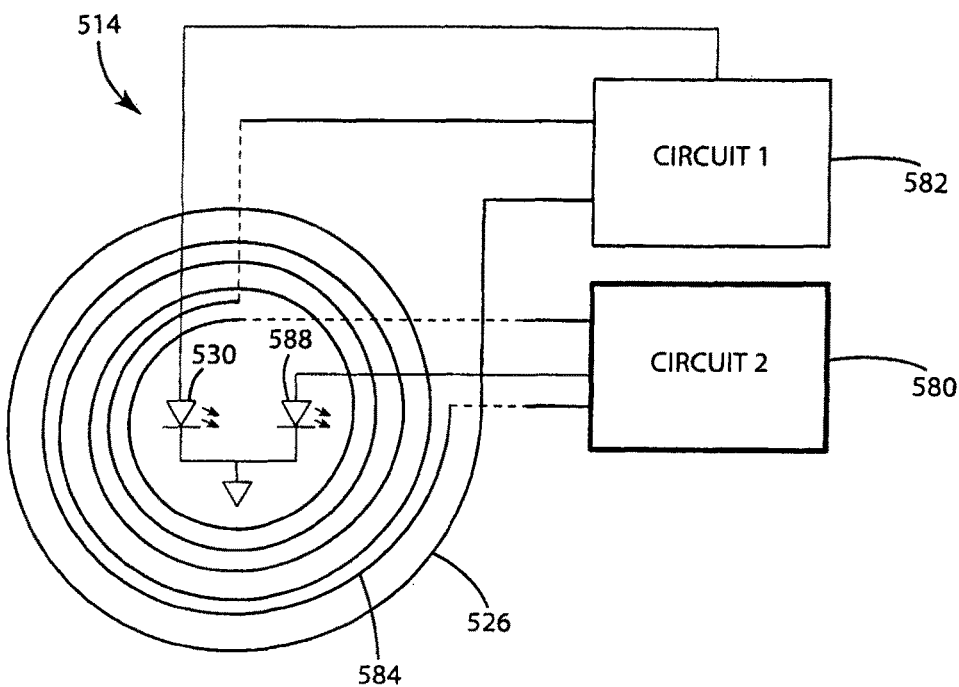
FIG. 14 is a schematic representation similar to FIG. 13 showing the LEDS.

In this embodiment, it can be desirable to configured the receiver coils 526 and 584 so that variations in the position and/or orientation of the wireless remote sensor 514 with respect to the inductive transmitter 512, and/or in the environment surrounding the coils, have essentially the same impact on coupling between the transmitter coil 516 and the two receiver coils 526, 584. To that end, it may be desirable to arrange the two receiver coils 526, 584 so that they receive generally the same flux from the transmitter coil 516. In the embodiment shown in FIGS. 12-14, the receiver coils 526, 584 are wound together around approximately the same axis and in approximately the same plane. Although the coils 526, 584 of this embodiment are generally circular in shape, they can vary in size and shape from application to application as desired. FIG. 12 shows the two coils 526, 584 in isolation from the remaining circuitry. As can be seen, the coils 526, 584 are wrapped with substantially parallel windings that extend about roughly the same axis and in roughly the same plane. With this configuration, the two coils should receive substantially the same amount of magnet flux from the inductive transmitter 512 under nearly all circumstances. FIG. 13 illustrates one way of coupling the remaining circuit components to the coils. In this embodiment, the remaining circuit components are simply connected to opposite ends of the corresponding coil. The position of the LEDs may vary from application to application. However, in the embodiment shown in FIG. 14, the reference LED 588 and the sensor LED 530 are disposed in the center of the coils 526, 584.

Figure 15:
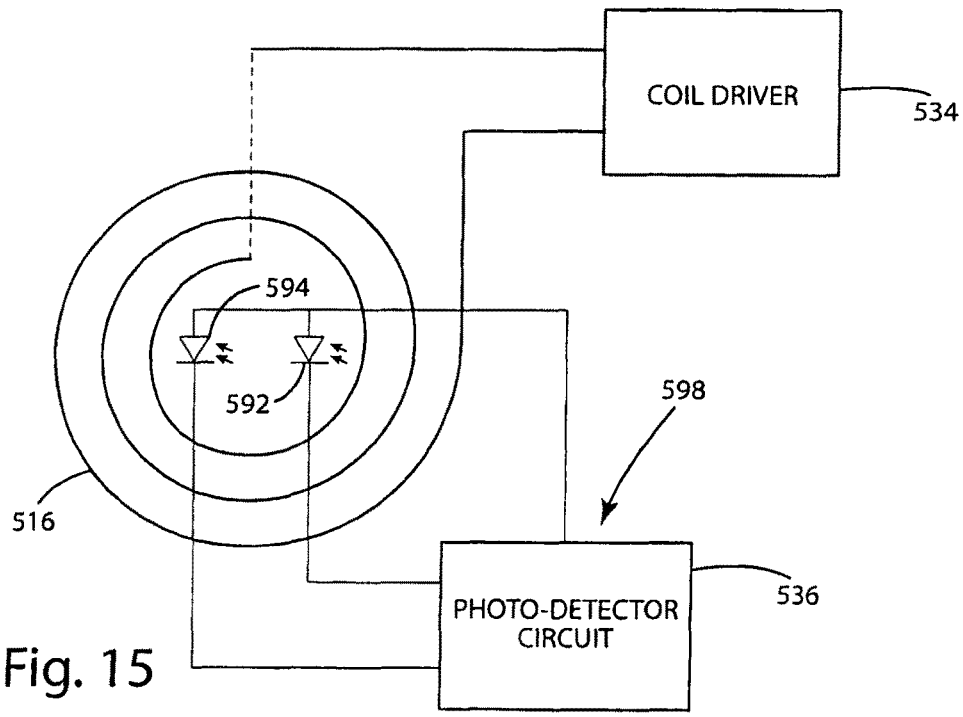
FIG. 15 is a schematic representation of an inductive transmitter configured to receive optical feedback from the circuit of FIG. 18.

The design and configuration of the inductive transmitter 512 may vary from application to application. FIG. 15 shows an embodiment configured for use with the wireless remote sensor 514 shown in FIG. 14. In this embodiment, the inductive transmitter 512 includes a transmitter coil 526 that is circular and corresponds in size and shape with the receiver coils 526, 584. The transmitter coil 526 may be driven by coil driver 534. As shown, the inductive transmitter 512 may include a photo-detector circuit 536 having optical sensors 592, 594 positioned in the center of the transmitter coil 526 in approximately the same position as reference LED 588 and sensor LED 530.

In a fourth aspect, the present invention includes a wireless remote sensor system having a wireless remote sensor 614 in which the receiving coil 626 is disposed on a substrate 650 having a relatively high coefficient of thermal expansion. In this aspect, changes in the size of the substrate 650 cause changes in the size and/or shape of the receiving coil 626. The changes in the receiving coil 626 result in corresponding changes in the reflected impedance of the receiving coil 626, which can be sensed in the inductive transmitter (not shown). For example, changes in the shape of the receiving coil 626 may be recognized by sensing in the inductive transmitter a characteristic of power that is affected by reflected impedance. The sensed characteristic may, for example, be current, voltage, phase or resonant frequency.

The configuration of the wireless remote temperature sensor 614 may vary from application to application. In the simplest embodiment, the wireless remote sensor 614 may generally include substrate 650, receiving coil 626 and a capacitor (not shown). Although not shown in FIG. 16, the capacitor may be connected across opposite ends of the coil 626 to create a resonant tank circuit. The substrate 650 may be essentially any material capable of supporting the receiving coil 626 and having a large enough coefficient of thermal expansion that the anticipated variations in temperature will result in changes in reflected impedance that can be recognized by sensing a characteristic of power in the inductive transmitter 612. In an alternative embodiment, the substrate may be a material that undergoes more permanent deformation in response to a variation in temperature. For example, the substrate may be a heat-shrink material that shrinks when it is heated to a desired temperature. The heat-shrinking of the material may vary the size and/or shape of the coil supported on the material. This change is size and/or shape may be sensed in the inductive transmitter. The heat-shrink material may be manufactured from a thermoplastic material such as polyolefin, fluoropolymer (such as FEP, PTFE or Kynar), PVC, neoprene, silicone elastomer or Viton.

The characteristics of the receiving coil 626 and capacitor may be selected to provide the resonant tank circuit with a resonant frequency that is at or near the operating frequency of the inductive transmitter. In the illustrated embodiment, the receiving coil 626 is manufactured from a printable ink. For example, the receiving coil 626 may be printed on the substrate 650. In this embodiment, the receiving coil 626 is printed directly on the substrate, but the wireless remote sensor 614 may include an intermediate material, if desired.

Figure 16:
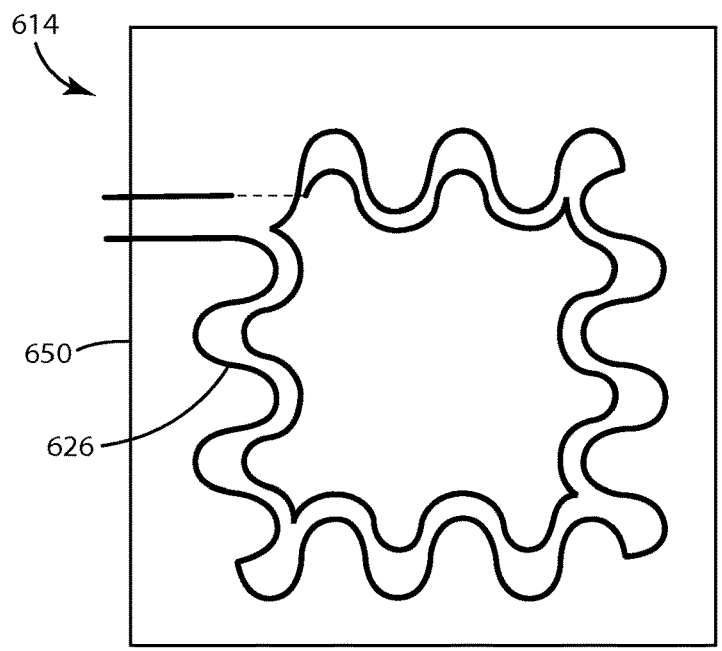
FIG. 16 is a schematic illustration of a wireless remote sensor in accordance with a fourth aspect of the present invention.

The size, shape and configuration of the receiving coil 626 may vary from application to application. In the embodiment of FIG. 16, the receiving coil 626 is manufactured from a material that is unable to expand and contract with the substrate 650. To allow the receiving coil 626 to nonetheless change shape with the substrate 650, the receiving coil 626 is formed with a plurality of undulations. In use, the undulations bend or flex as the substrate 650 expands and contracts. This bending and flexing results in material changes in the overall size and/or shape of the receiving coil 626. The receiving coil 626 may alternatively be manufactured from a material that is capable of expanding and contracting with the underlying substrate. For example, the receiving coil 626 may be manufactured from printed silver ink conductors. In applications where the receiving coil 626 is able to expand and contract, it may be provided with a more regular shape, such as a simple spiral winding.

The capacitor (not shown) may be essentially any capacitive element, such as a printed ink capacitor or a conventional capacitor. When a printed ink capacitor is included, it may be printed on the substrate 650, if desired. In some applications, the internal capacitance of the receiving coil 626 may be sufficient to form a resonant tank circuit. In such applications, a separate capacitor may not be included.

Figure 17:
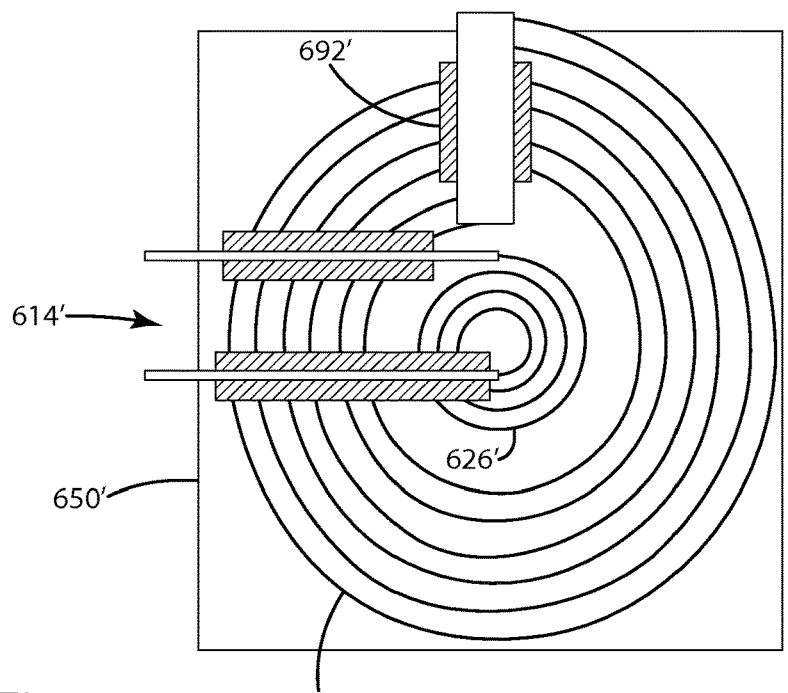
FIG. 17 is a schematic illustration of an alternative wireless remote sensor in accordance with the fourth aspect of the invention.

In an alternative embodiment shown in FIG. 17, the wireless remote sensor 614' includes a re-resonator coil 690' positioned adjacent the receiving coil 626'. As shown, the re-resonator coil 690' may be wrapped around the receiving coil 626', with the two coils sharing a generally common axis and extending through roughly the same plane. In this embodiment, the re-resonator coil 690' receives power from the inductive transmitter (not shown), amplies the received power and transmits it to the receiving coil 626'. The re-resonator coil 690' may be coupled with a capacitor 692'. The capacitor 692' may be a printed ink capacitor, if desired.

As with the embodiment of FIG. 16, the receiving coil 626' may be connected in series with a capacitor (not shown). The capacitor may be essentially any capacitive element, such as a printed ink capacitor or a conventional capacitor. A separate capacitor may be eliminated when the internal capacitance of the receiving coil 626' is sufficient to form an adequate resonant tank circuit.

Figure 22:
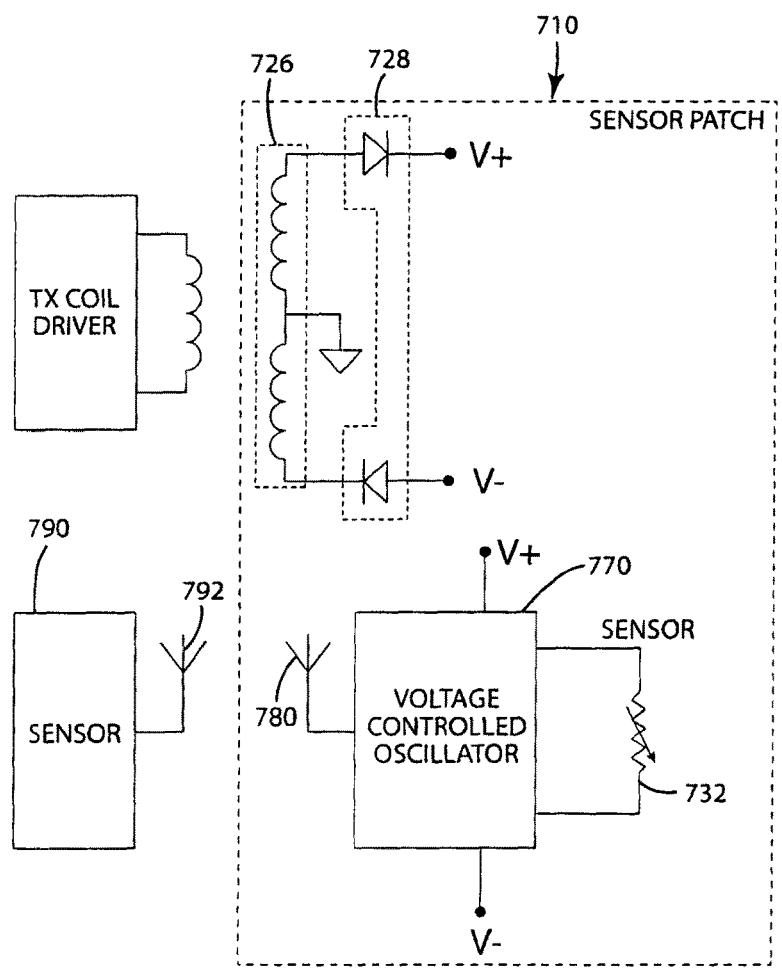
FIG. 22 is a schematic example of a VCO output driving an antenna to transmit the output signal back to a pickup sensor through the electric field.
Figure 23:
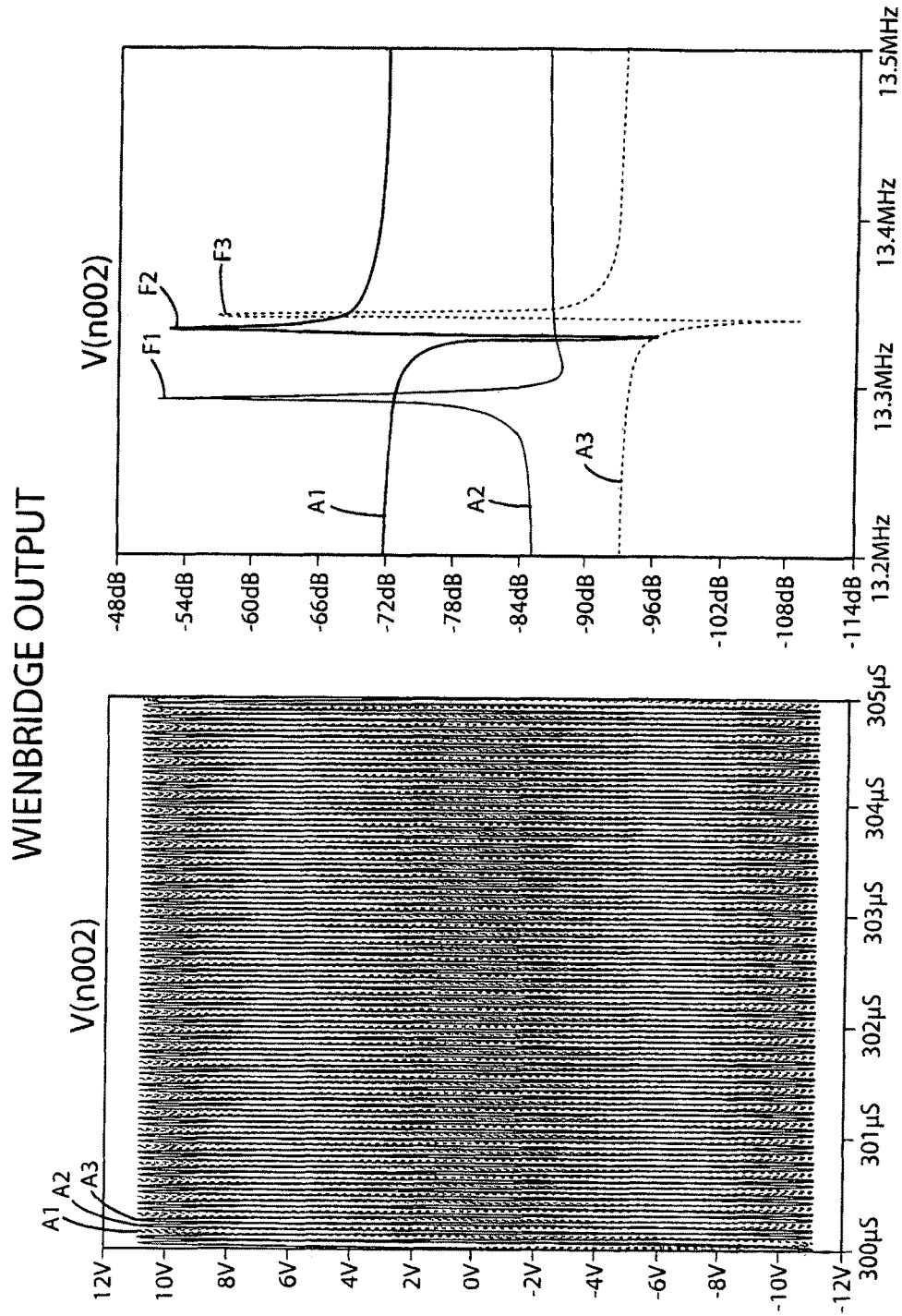
FIG. 23 shows the output of the Wienbridge oscillator, both in the time domain (left image) and the frequency domain (right image).

In a fifth aspect, the wireless remote sensor system 710 may include a VCO 770 that produces a signal dependent on the value of variable impedance element 732. The signal is applied to an antenna 780, which transmits the signal to a base sensor 790 (See FIG. 22). This signal may be directly applied to the antenna 780 or may be applied through a buffer, amplifier, filter, or any combination of signal conditioning circuits and then applied to the antenna 780. The base sensor 790 may include an antenna 792 configured to receive the signal from antenna 780. By using a separate antenna 780, the signal may have less interaction with the power transfer signal which mainly uses magnetic fields to transfer power. The electromagnetic wave produced by the antenna 780 would be mostly an electric field, providing vector-domain isolation between the signals since the magnetic field lines are perpendicular to the electric field lines. The base sensor 790 would then monitor the frequency of the signal and compare it to a reference frequency, or would use other characteristics of the signal to determine information about the sensor (or variable impedance element 732). For example, the frequency could vary in time, with the rate of change in frequency being indicative of the pulse rate of a medical patient. FIG. 23 shows an example of the frequency response for different values of the variable resistance R3 from the Wienbridge VCO of FIG. 21. The plot on the left side of FIG. 23 shows a series of three different waveforms A1, A2 and A3 overlayed one on top of one another. Each waveform results from a different value of the variable impedance element R3. Although difficult to see in the left side of FIG. 23, each waveform A1, A2 and A3 has a different frequency. This is illustrated more clearly in the plot on the right side of FIG. 23, which is a plot of the frequency responses F1, F2 and F3 of the three waveforms A1, A2 and A3 created using FFT. It can be seen that the frequency of the signal (represented by the peak value of the FFT representation of the signal on the right) varies with the resistance of variable impedance element 732.

Figure 24:
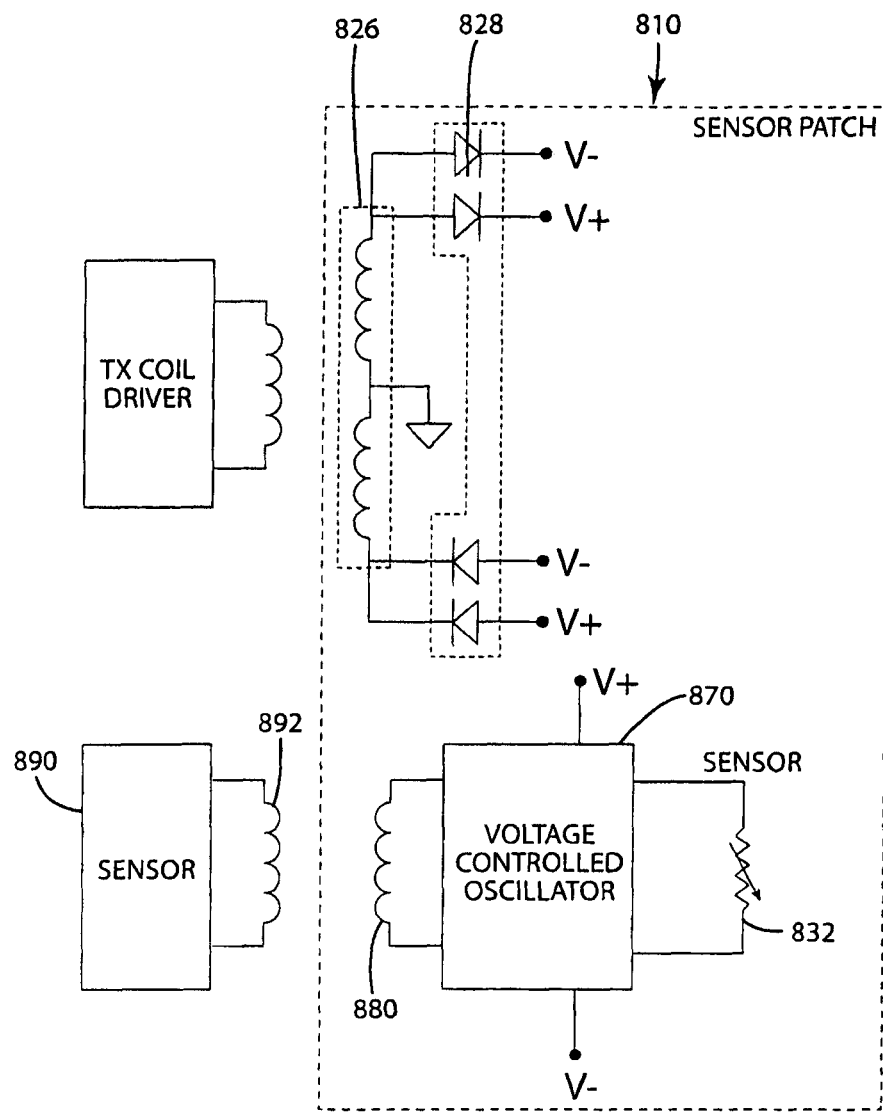
FIG. 24 shows the output of the VCO connected to a coil that transmits the output signal through the magnetic field.
Figure 25:
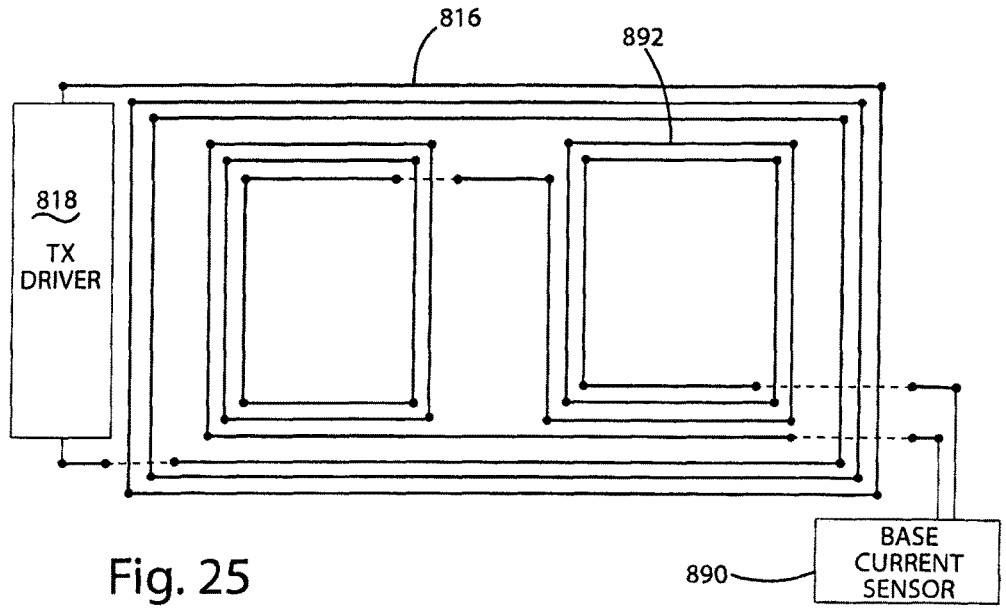
FIG. 25 shows the 'FIG. 8' coil previously described as a way to keep the two magnetic fields from interfering with one another.

In a sixth aspect, the wireless remote sensor system 810 may include a VCO 870 that produces a signal which is applied to a separate coil 880 and transmitted to the base sensor 890. This signal may be directly applied to coil 880 or may be applied through a buffer, amplifier, filter, or any combination of signal conditioning circuits and then applied to the coil 880. The base sensor 890 may include a corresponding receiving coil 892 configured to receive the signal from coil 880. By using a separate coil 880, the signal may have less interaction with the power transfer signal. The electromagnetic wave produced by the separate coil 880 could be isolated from the power transfer signal in frequency by making the feedback signal a much higher or lower frequency than the power transfer signal. The fields could further be isolated from the power transfer signals by locating the coils remotely, or by winding the signal coil in a counterwound or "FIG. 8" topology. FIG. 25 shows an example of a counterwound or "FIG. 8" topology on the transmitter side. As shown, the transmitter coil 816 is physically positioned outside the base sensor coil 892, and the base sensor coil 892 is counterwound as discussed above in connection with FIG. 9. The base sensor 890 would then monitor the frequency of the signal and compare it to a reference frequency, or would use other characteristics of the signal to determine information about the sensor or variable impedance element 832. The VCO 870 may require a positive and negative voltage supply in order to accurately measure the impedance of the variable impedance element. To provide this, the power transfer coil 826 on the receiver 810 may be a center-tapped configuration wherein the center tap is attached to the neutral, or zero-volt reference of the receiver, and a diode bridge 828 connects the ends of the coil to the positive and negative voltages. By using a two diode bridge 728 such as the circuit shown in FIG. 22, current flows in one direction and energy is received for only half of the power transfer cycle. By using a four diode bridge 828, such as the circuit shown in FIG. 24, current flows in both directions and energy is received for the full power transfer cycle.

The above description is that of current embodiments of the invention. Various alterations and changes can be made without departing from the spirit and broader aspects of the invention as defined in the appended claims, which are to be interpreted in accordance with the principles of patent law including the doctrine of equivalents. This disclosure is presented for illustrative purposes and should not be interpreted as an exhaustive description of all embodiments of the invention or to limit the scope of the claims to the specific elements illustrated or described in connection with these embodiments. For example, and without limitation, any individual element(s) of the described invention may be replaced by alternative elements that provide substantially similar functionality or otherwise provide adequate operation. This includes, for example, presently known alternative elements, such as those that might be currently known to one skilled in the art, and alternative elements that may be developed in the future, such as those that one skilled in the art might, upon development, recognize as an alternative. Further, the disclosed embodiments include a plurality of features that are described in concert and that might cooperatively provide a collection of benefits. The present invention is not limited to only those embodiments that include all of these features or that provide all of the stated benefits, except to the extent otherwise expressly set forth in the issued claims. Any reference to claim elements in the singular, for example, using the articles "a," "an," "the" or "said," is not to be construed as limiting the element to the singular.

The invention claimed is:

1. A wireless remote sensor for sensing a first external parameter and a second external parameter comprising:
   a receiver coil configured to receive power wirelessly from a wireless power transmitter;
   an oscillating circuit coupled to said receiver coil whereby oscillations of said oscillating circuit are communicated to the wireless power transmitter by reflected impedance, said oscillating circuit having a first variable impedance element that is configured to vary in response to changes in a value of a sensed first external parameter and a second variable impedance element that is configured to vary in response to changes in a value of a sensed second external parameter, wherein the first and second variable impedance elements are capable of varying independently of power received wirelessly from the wireless power transmitter; and
   wherein a duty cycle of said oscillations varies based on variations in said first and second variable impedance elements, whereby said duty cycle of said oscillations is affected by sensed variations in the value of the sensed first and sensed second external parameters.

2. The remote sensor of claim 1 wherein said oscillating circuit includes a charge/discharge circuit configured to alternately charge and discharge said oscillating circuit, said oscillations corresponding with said charge and discharge of said oscillating circuit.

3. The remote sensor of claim 2 wherein said charge/discharge circuit includes a charge subcircuit with a charge capacitor that is charged by power wirelessly received via said receiver coil.

4. The remote sensor of claim 3 wherein said charge/discharge circuit includes a trigger for transitioning said charge/discharge circuit between a charge state and a discharge state, said trigger being a diode having a reverse breakdown voltage selected to transition said charge/discharge circuit from said charge to said discharge when said charge capacitor reaches a threshold.

5. The remote sensor of claim 3 wherein said charge/discharge circuit includes a discharge subcircuit having a current latch configured to selectively discharge said charge capacitor.

6. The remote sensor of claim 5 wherein said charge subcircuit includes a charge resistor, said charge resistor being said first variable impedance element.

7. The remote sensor of claim 5 further including a discharge resistor, said discharge resistor being said second variable impedance element.

8. The remote sensor of claim 5 wherein said first variable impedance element being a variable resistor in said charge subcircuit, said second variable impedance element being a variable resistor arranged to vary a duration of said discharge state.

9. The remote sensor of claim 3 further including a normalization circuit for normalizing a voltage provided to said charge subcircuit.

10. The remote sensor of claim 9 wherein said normalization circuit includes a voltage clamp.

11. The remote sensor of claim 3 wherein said charge/discharge circuit includes a trigger for transitioning said charge/discharge circuit between a charge state and a discharge state, said trigger being a comparator and a voltage divider selected to maintain a substantially uniform charge duration despite variations in voltage provided to said charge subcircuit.

12. The remote sensor of claim 11 wherein said comparator includes a first input coupled to an output of said voltage divider and a second input coupled to an output of said charge subcircuit.

13. The remote sensor of claim 12 wherein said charge/discharge circuit includes a discharge subcircuit having a current latch configured to selectively discharge said charge capacitor, an output of said comparator coupled to said current latch, whereby said comparator output engages said current latch.

14. The remote sensor of claim 5 wherein said discharge subcircuit include a modulating leg, said modulating leg having a modulating resistor, said modulating leg coupled to said current latch whereby said modulating leg is applied only when said current latch is on.

15. The remote sensor of claim 14 wherein said modulating leg is coupled to said current latch by a transistor, said modulating resistor having a value selected to cause said transistor to operate as an amplifier dependent at least in part on a variable impedance element.

16. A wireless remote sensor for sensing a first external parameter and a second external parameter comprising:
  a receiver coil configured to receive power wirelessly from a wireless power transmitter;
  a communication circuit including a voltage controlled oscillator operatively coupled to said receiver coil to receive power from said receiver coil;
  a first variable impedance element coupled to said communication circuit including said voltage controlled oscillator, whereby output oscillations of said communication circuit including said voltage controlled oscillator are dependent on a value of said first variable impedance element, said first variable impedance element is configured to vary in response to changes in a value of a sensed first external parameter, wherein said first variable impedance element is capable of varying independently of power received wirelessly from the wireless power transmitter;
  a second variable impedance element coupled to said communication circuit including said voltage controlled oscillator, whereby said output oscillations of said communication circuit including said voltage controlled oscillator are dependent on a value of said second variable impedance element, said second variable impedance element is configured to vary in response to changes in a value of a sensed second external parameter, wherein said second variable impedance element is capable of varying independently of power received wirelessly from the wireless power transmitter; and
  wherein a duty cycle of said output oscillations varies based on variations in said second variable impedance element such that said duty cycle of said output oscillations is affected by variations in the value of the sensed second external parameter that are sensed by said second variable impedance element.

17. The remote sensor of claim 16 further including an antenna, said output oscillations of said communication circuit including said voltage controlled oscillator being applied to said antenna, whereby said output oscillations may be communicated to a base sensor.

18. The remote sensor of claim 16 further including a signal coil, said output oscillations of said communication circuit including said voltage controlled oscillator being applied to said signal coil, whereby said output oscillations may be communicated to a base sensor.

19. The remote sensor of claim 16 further including a load, said output oscillations of said communication circuit including said voltage controlled oscillator being applied to a modulating subcircuit for modulating said load to said receiver coil, whereby said output oscillations may be communicated to a base sensor through said receiver coil by reflected impedance.

20. The remote sensor of claim 19 wherein said modulating subcircuit includes a MOSFET, said output oscillations being applied to a gate of said MOSFET.

21. The remote sensor of claim 20 wherein said MOSFET is coupled to a voltage offset circuit, which is coupled to said second variable impedance element, whereby a duty cycle of said load is dependent on a value of said second variable impedance element.

22. A wireless remote sensor system for sensing a first external parameter and a second external parameter comprising:
  an inductive transmitter with a transmitter coil;
  a wireless remote sensor having:
    a receiver coil configured to receive power wirelessly from a wireless power transmitter;
    a communication circuit including a voltage controlled oscillator operatively coupled to said receiver coil to receive power from said receiver coil;
    a first variable impedance element coupled to said communication circuit including said voltage controlled oscillator such that output oscillations of said communication circuit including said voltage controlled oscillator are dependent on a value of said first variable impedance element, said first variable impedance element is configured to vary in response to changes in a value of a sensed first external parameter, wherein said first variable impedance element is capable of varying independently of power received wirelessly from the wireless power transmitter;
    a second variable impedance element coupled to said communication circuit including said voltage controlled oscillator such that said output oscillations of said communication circuit including said voltage controlled oscillator are dependent on a value of said second variable impedance element, said second variable impedance element is configured to vary in response to changes in a value of a sensed second external parameter, wherein the second variable impedance element is capable of varying independently of power received wirelessly from the wireless power transmitter;
    wherein a duty cycle of said output oscillations varies based on variations in said first variable impedance element such that said duty cycle of said output oscillations is affected by variations in the value of the sensed first external parameter that are sensed by said first variable impedance element; and a signal receiver configured to wirelessly receive a signal generated from said output oscillations, said signal receiver being configured to determine variations in said first variable impedance element as a function of said signal generated from said output oscillations and variations in said second variable impedance element as a function of said signal generated from said output oscillations.

23. The wireless remote sensor system of claim 22 wherein said wireless remote sensor includes a transmitter antenna, said output oscillations of said communication circuit including said voltage controlled oscillator being applied to said transmitter antenna for wireless transmission to said signal receiver.

24. The wireless remote sensor system of claim 23 wherein said signal receiver includes a receiver antenna configured to receive signals transmitted by said transmitter antenna.

25. The wireless remote sensor system of claim 22 wherein said wireless remote sensor includes a signal transmit coil separate from said receiver coil, said output oscillations of said communication circuit including said voltage controlled oscillator being applied to said signal transmit coil for wireless transmission to said signal receiver.

26. The wireless remote sensor system of claim 25 wherein said signal receiver includes a signal receive coil separate from said transmitter coil configured to receive signals transmitted by said signal transmit coil.

27. The wireless remote sensor system of claim 26 wherein said signal transmit coil and said signal receive coil are counterwound in a FIG. 8 configuration.

28. The wireless remote sensor system of claim 22 wherein the first variable impedance element is a thermistor, and wherein the sensed first external parameter to be sensed is temperature.

29. The wireless remote sensor of claim 1 wherein the first variable impedance element is a thermistor, and wherein the sensed first external parameter to be sensed is temperature.

30. The wireless remote sensor of claim 16 wherein the first variable impedance element is a thermistor, and wherein the sensed first external parameter to be sensed is temperature.

* * * * *